(12) United States Patent
Ohizumi et al.

(10) Patent No.: US 8,034,723 B2
(45) Date of Patent: Oct. 11, 2011

(54) FILM DEPOSITION APPARATUS AND FILM DEPOSITION METHOD

(75) Inventors: Yukio Ohizumi, Iwate (JP); Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/975,252

(22) Filed: Dec. 21, 2010

(65) Prior Publication Data
US 2011/0159702 A1 Jun. 30, 2011

(30) Foreign Application Priority Data

Dec. 25, 2009 (JP) .................................. 2009-296182

(51) Int. Cl.
*H01L 21/469* (2006.01)

(52) U.S. Cl. ........ 438/758; 438/778; 438/680; 438/685; 438/790; 257/E21.211; 257/E21.276; 257/E21.257; 118/728; 118/730; 118/719; 118/712; 427/10; 427/595; 427/569

(58) Field of Classification Search ............... 438/758, 438/778, 680, 685, 690; 257/E21.211, E21.276, 257/E21.257; 118/728, 730, 712, 719; 427/10, 427/595, 569
See application file for complete search history.

(56) References Cited

U.S. PATENT DOCUMENTS

| 6,121,164 | A | * | 9/2000 | Yieh et al. ..................... 438/790 |
| 6,634,314 | B2 | | 10/2003 | Hwang et al. |
| 7,153,542 | B2 | | 12/2006 | Nguyen et al. |
| 2001/0007244 | A1 | | 7/2001 | Matsuse |
| 2006/0073276 | A1 | | 4/2006 | Antonissen |
| 2007/0218701 | A1 | | 9/2007 | Shimizu et al. |
| 2007/0218702 | A1 | | 9/2007 | Shimizu et al. |

FOREIGN PATENT DOCUMENTS

| JP | 04-287912 | 10/1992 |
| JP | 09-115994 | 5/1997 |
| JP | 3144664 | 3/2001 |
| JP | 2001-254181 | 9/2001 |
| JP | 2007-247066 | 9/2007 |
| JP | 2008-516428 | 5/2008 |
| WO | WO2006/042074 | 4/2006 |

* cited by examiner

*Primary Examiner* — William M Brewster
*Assistant Examiner* — Wilner Jean Baptiste
(74) *Attorney, Agent, or Firm* — IPUSA, PLLC

(57) ABSTRACT

A film deposition apparatus for depositing a film on a substrate by performing a cycle of alternately supplying at least two kinds of reaction gases that react with each other on the substrate to produce a layer of a reaction product in a vacuum chamber is disclosed. The film deposition apparatus includes a ring-shaped locking member that may be provided in or around a wafer receiving portion of a turntable in which the substrate is placed, in order to keep the substrate in the substrate receiving portion.

11 Claims, 18 Drawing Sheets

FILM DEPOSITION APPARATUS AND FILM DEPOSITION METHOD

CROSS-REFERENCE TO RELATED APPLICATION

This application is based on and claims the benefit of priority of Japanese Patent Application No. 2009-296182, filed on Dec. 25, 2009 with the Japanese Patent Office, the entire contents of which are hereby incorporated by reference.

BACKGROUND OF THE INVENTION

1. Field of the Invention

The present invention relates to a film deposition apparatus and a film deposition method for depositing a film on a substrate by carrying out plural cycles of supplying in turn at least two source gases to the substrate in order to form a layer of a reaction product.

2. Description of the Related Art

As a film deposition technique in a semiconductor fabrication process, there has been known a so-called Atomic Layer Deposition (ALD) or Molecular Layer Deposition (MLD). In such a film deposition technique, a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer; and such an alternating adsorption of the gases is repeated plural times, thereby depositing a film on the wafer. This technique is advantageous in that the film thickness can be controlled at higher accuracy by the number of times alternately supplying the gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis (tertiary-butylamino) silane (BTBAS) gas or the like is used as a first reaction gas (source gas) and ozone gas or the like is used as a second reaction gas (oxidation gas).

In order to carry out such a deposition method, use of a single-wafer deposition apparatus having a vacuum chamber and a shower head at a top center portion of the vacuum chamber has been under consideration. In such a deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long process time because the number of cycles may reach several hundred. Therefore, a deposition method and an apparatus that enable high throughput are desired.

There are two types of the ALD methods. First, the ALD method of the first type is explained, taking an example of using a film deposition apparatus having a wafer receiving portion that is fixed in an evacuatable reaction chamber and on which a wafer is placed.

(1) First, the wafer is transferred into the reaction chamber and placed on the wafer receiving portion. In this case, only one wafer may be placed (a single-wafer process), or plural wafers may be placed (a batch process).

(2) After the wafer(s) is placed on the wafer receiving portion, the reaction chamber is evacuated to vacuum and film deposition conditions are set during evacuation. Specifically, a temperature of the wafer receiving portion (wafer temperature) is set at a temperature suitable for the ALD, and a pressure in the reaction chamber is set at a pressure suitable for the ALD.

(3) After the film deposition conditions are set, a reaction gas A is supplied to the reaction chamber for a predetermined period of time.

(4) Then, supplying the reaction gas A is terminated, and the reaction gas A is evacuated from the reaction chamber, in order to reduce intermixture and reaction of the reaction gas A remaining in the reaction chamber and a reaction B to be subsequently supplied.

(5) The reaction gas B is supplied to the reaction chamber for a predetermined period of time.

(6) The reaction gas B is terminated, and evacuated from the reaction chamber in the same manner as the step (4). This is carried out in order to reduce intermixture and reaction of the reaction gas B remaining in the reaction chamber and the reaction B to be supplied again.

(7) The above steps (3) through (6) are repeated at a predetermined times.

(8) When a film thickness of the film deposited on the wafer reaches a predetermined value, all the reaction gases are stopped; a pressure of the reaction chamber is returned to an atmospheric pressure; and the wafer is transferred out from the reaction chamber.

The ALD method of the first type is advantageous in that the reaction gases A, B can be substantially prevented from being intermixed in the reaction chamber because the reaction chamber can be fully evacuated before supplying the reaction gases A, B. On the other hand, film deposition time is lengthened because this method includes steps of supplying the reaction gas A, evacuating the reaction gas A, supplying the reaction gas B, and evacuating the reaction gas B (namely, the reaction chamber needs to be evacuated to vacuum in order to avoid intermixture of the reaction gases A, B). In addition, because process controlling instruments such as valves and mass flow controllers used in a gas supplying system and valves in a gas evacuation system of the film deposition apparatus need to be opened and closed many times during the film deposition time, the process controlling instruments are subject to maintenance at relatively high frequency, which reduces utilization rate of the film deposition apparatus and productivity.

In order to reduce the film deposition time due to the time-consuming evacuation processes, thereby reducing the frequency of the maintenance of the process controlling instruments and improving the productivity, use of an ALD apparatus with a rotatable susceptor on which plural of the wafers are placed is considered, which is explained in the following as the ALD method of a second type.

A mini-batch type ALD apparatus with the rotatable susceptor is used in the second type. This apparatus includes a reaction chamber whose inside can be maintained at reduced pressures and a turntable rotatably provided in the reaction chamber. The turntable can hold as many wafers as desired depending on a size of the wafer to be processed and a diameter of the turntable.

In the ALD method of the second type, (1) first, plural wafers are placed on the turntable in the reaction chamber;

(2) after the plural wafers are placed on the turntable, the reaction chamber is evacuated to vacuum, the turntable starts rotating, and the wafers are heated at a predetermined temperature;

(3) a separation gas is supplied at a predetermined flow rate to an area between reaction areas where corresponding reaction gases are supplied;

(4) when predetermined reaction gases are supplied at predetermined flow rates to upper surfaces of the wafers, the upper surfaces of the wafers are exposed alternatively to the reaction gases, thereby carrying out the ALD; and (5) after a film having a predetermined thickness is obtained on each of the wafers, the reaction gases are stopped, the turntable stops rotating, and the inner pressure of the reaction chamber is returned to the atmospheric pressure.

The ALD method of the second type is advantageous in that the film thickness can be adjusted by the number of rotations of the turntable.

In addition, because supplying the reaction gases A, B and evacuating the reaction gases A, B are carried out at the same time, the number of ON/OFF operations of the process controlling instruments is reduced and thus the process controlling instruments are subject to maintenance at relatively low frequency, which may increase utilization rate of the film deposition apparatus and productivity.

In the ALD method of the second type, plural areas where the corresponding reaction gases are supplied and an area where the reaction gases are evacuated are required in the reaction chamber. In order to avoid intermixture of the reaction gases in the reaction chamber, it can be easily understood that independent reaction areas (compartments) should be created by partition walls. However, bottom ends of the partition walls need to be as close to the turntable as possible in order to sufficiently avoid gaseous communication between the reaction areas. Alternatively, the turntable needs to be intermittently rotated. Namely, the reaction areas are enclosed so that the turntable is raised to contact the partition walls via a sealing member therebetween, and the wafers on the turntable are exposed to the reaction gas in the corresponding enclosed reaction area. In this method, the turntable cannot be continuously rotated, which may increase the film deposition time.

Therefore, a mechanism is required for separating the reaction gases in order to alternatively expose the upper surfaces of the wafers to the reaction gases while avoiding the intermixture of the reaction gases even when the turntable is rotated at higher rotation speed.

Patent Document 1 discloses a method of evacuating reaction gases along with a separation gas through an evacuation opening provided at an upper portion of the reaction chamber between an ejection opening of the separation gas and an area where a reaction gas is supplied.

Patent Document 2 discloses a method of separating the reaction gases by use of air-curtain effect while a wafer supporting member is rotated.

Patent Document 3 discloses a method of rotating a wafer receiving member having a partition wall and a slanted surface where a wafer is placed so that the wafer on the slanted surface can cope with the centrifugal force due to the rotation of the wafer receiving member, so that the wafer passes through process areas and evacuation areas.

Patent Document 4 discloses a method of depositing a film by alternately ejecting two reaction gases.

Patent Document 5 discloses a method of supplying a source reaction gas from a rotatable nozzle to a reaction area including a vacuum evacuation opening and purging the source reaction gas by the rotatable nozzle.

In a film deposition apparatus and film deposition method disclosed in Patent Document 6 (7, and 8), after a source gas (or a reaction gas) is supplied to an area where a wafer is placed, an environment of the area is purged with a purge gas by use of a separation gas nozzle.

Patent Document 9 discloses a turntable on which plural wafers are placed, plural supplying zones (or supplying opening) from which corresponding reaction gases are supplied and that are provided at circumferential intervals, and two evacuation zones (or evacuation opening) provided along the circumferential direction between the plural supplying zones.

Patent Document 10 discloses a clamp ring that fixes a wafer placed in a wafer receiving area of a susceptor (or platen) in order to avoid wafer damage or breakage that may be caused when centrifugal force due to rotation of the susceptor forces the wafer to hit an inner side wall of the wafer receiving area.

Patent Document 1: U.S. Pat. No. 7,153,542 (FIGS. 6(*a*), 6(*b*))

Patent Document 2: Japanese Patent Application Laid-Open Publication No. 2001-254181 (FIGS. 1 and 2)

Patent Document 3: Japanese Patent Publication No. 3144664 (FIGS. 1 and 2, claim 1)

Patent Document 4: Japanese Patent Publication Laid-Open Publication No. H04-287912

Patent Document 5: U.S. Pat. No. 6,634,314

Patent Document 6: Japanese Patent Publication Laid-Open Publication No. 2007-247066 (paragraphs 0023 through 0025, and 0058, FIGS. 12 and 18)

Patent Document 7: U.S. Patent Application Publication No. 2007/218701

Patent Document 8: U.S. Patent Application Publication No. 2007/218702

Patent Document 9: Published Japanese Translation of PCT International Publication No. 2008-516428 (or corresponding U.S. Patent Publication No. 2006/0073276)

Patent Document 10: Japanese Patent Application Laid-Open Publication No. H09-115994 (FIGS. 4, 6, and 7)

SUMMARY OF THE INVENTION

The inventors of the present invention have investigated the following configuration shown in FIGS. 1 and 2 in their development of a film deposition apparatus where plural substrates are arranged on a turntable along a rotation direction of the turntable. In these drawings, a reference symbol 31 represents a first reaction gas nozzle that supplies, for example, bis (tertiary-butylamino) silane (BTBAS), and an area below the first reaction gas nozzle 31 is a first process area P1. In addition, a reference symbol 32 represents a second reaction gas nozzle that supplies, for example, $O_3$ gas, and an area below the second reaction gas nozzle is a second process area P2. Reference symbols 41, 42 represent separation gas nozzles that supply separation gases. The reaction gas nozzles 31, 32 and the separation gas nozzles 41, 42 are arranged extending in the radius direction of the turntable 2 above the turntable 2. These gas nozzles 31, 32, 41, 42 have plural ejection holes that are formed along longitudinal directions of the corresponding gas nozzles 31, 32, 41, 42 and eject the corresponding gases toward the turntable 2. On both sides of the separation gas nozzles 41, 42, sector-shaped convex portions 4 that protrude downward from a ceiling and thin spaces are created between the convex portions 4 and the turntable 2. The thin spaces serve as separation areas D that separate the first process area P1 and the second process area P2.

In order to avoid pressure reduction in the thin spaces between the convex portions 4 and the turntable, the separation gas is not directly evacuated from the separation areas D but evacuated after flowing toward the process areas P1, P2. For example, the separation gas (N2 gas) flows along the rotation direction of the turntable 2 from the separation area D toward the process area 21, flows through a space between the reaction gas nozzle 31 and the turntable 2 (or above the reaction gas nozzle 31), and then is evacuated along with the BTBAS gas ejected from the reaction gas nozzle 31 from an evacuation port 61 that is located downstream relative to the rotation direction of the turntable 2 in relation to the reaction gas nozzle 31 and outside the turntable 2. A reference symbol C in FIG. 1 represents a center area C that has an ejection hole that ejects another separation gas in order to separate atmospheres of the first process area 21 and the second process area P2. An inert gas such as a nitrogen gas is used as the separation gases.

Through the investigation about the above configuration, the inventors obtained the following knowledge. When a rotation speed of the turntable 2 is low, the BTBAS gas is substantially saturated in the process area P1 below the reaction gas nozzle 31, and thus the BTBAS gas can be fully adsorbed in the wafer W on the turntable 2. However, when the rotation speed of the turntable 2 is increased to, for example, 120 revolutions per minute in order to realize higher throughput, the separation gas flows at higher speed into the process area P1 below the reaction gas nozzle 31, thereby reducing a concentration of the BTBAS gas. As a result, the BTBAS gas is not fully adsorbed on the wafer W. An amount of the BTBAS gas adsorbed is proportional to the BTBAS gas concentration and a period of time during which the wafer W is exposed to the BTBAS gas. In the case of the high rotation speed of the turntable 2, because the BTBAS gas concentration is reduced, the amount of the BTBAS gas adsorbed on the wafer W is reduced.

In addition, when gas is flowing toward an object, the gas tends to flow around the object to the rear area of the object, because a pressure of the rear area is lower than that of a front area of the object. Namely, when the separation gas is flowing toward the reaction gas nozzle 31, the separation gas tends to flow into the process area P1 below the reaction gas nozzle 31 and flow upward behind the reaction gas nozzle 31. In this case, the separation gas guides the reaction gas ejected from the reaction gas nozzle 31 to the process area P1 in an upward direction. Therefore, the BTBAS gas concentration may be further reduced, and a period of time during which the wafer W is exposed to the reaction gas is reduced. As a result, the amount of the BTBAS gas adsorbed on the wafer W is further reduced.

Therefore, the rotation speed of the turntable needs to be reduced in order to lengthen the time period during which the wafer W is exposed to the reaction gas and to maintain the reaction gas concentration, thereby reducing the throughput.

The inventors of the present invention have tried to improve the throughput in the film deposition apparatus that is provided with a first process area where a first reaction gas is supplied and a second process area where a second reaction gas is supplied, which are provided in order to alternately supply plural reaction gases to an upper surface of a wafer in a vacuum chamber, thereby depositing plural layers of by-products of the reaction gases; and a separation area that separates the first process area and the second process area.

However, the inventors have found that the wafer may be made to float upward and thrown out from a concave portion serving as a wafer receiving portion in the above film deposition apparatus when the turntable is rotated at relatively high rotation speed.

An example of film deposition parameters in the above film deposition apparatus when the ALD is carried out is as follows. An inner pressure of the vacuum chamber is 1067 Pa (8 Torr); a flow rate of the BTBAS gas supplied to the process area P1 is 100 standard cubic centimeters per minute (sccm); a flow rate of the $O_3$ gas supplied to the second process area P2 is 10 standard liters per minute (slm); a flow rate of the $N_2$ gas supplied to each of the separation areas is 20 slm. In this case, a flow rate difference of a factor of 100 or more is made in the vacuum chamber, which creates a pressure difference of a factor of 100 or more. Namely, there is a pressure difference of a factor of 100 or more in the vacuum chamber. When the wafer moves through the process area P1, the process area P2, and the separation areas D by the rotation of the turntable at a rotation speed of about 240 rpm when there is such a relatively large pressure difference, the wafer may be made to float upward.

In addition, when the wafer is placed in a wafer receiving portion (concave portion) of the turntable, there is a gap between the circumferential edge of the wafer and the inner circumferential wall of the concave portion, for a convenience of placing the wafer in the concave portion or taking the wafer out of the concave portion. When the reaction gases and/or the separation gases flowing toward the turntable at a flow rate of, for example, 10 slm are blown into the gap, the wafer may be made to float upward from the concave portion. Namely, in addition to the pressure difference in the vacuum chamber, the gap between the wafer and the concave portion may cause the wafer to float upward.

In order to avoid having the wafer float upward, the inventors tried to provide a locking mechanism for the wafer. However, the locking mechanism needs to have a locking portion that holds in the wafer in order to avoid having the wafer float upward from the concave portion, which may cause a different problem. Namely, the locking portion may disturb a flow of the gases flowing over the wafer under viscous flow conditions in the vacuum chamber (note that the inner pressure of the vacuum chamber is, for example, 1067 Pa (8 Torr)), so that streaks are made in the film deposited on the wafer.

In addition, centrifugal force due to the rotation of the turntable is applied to the wafer placed in the wafer receiving portion of the turntable.

The present invention provides a film deposition apparatus that substantially prevents a wafer placed in a wafer receiving area of a turntable from floating upward due to a pressure difference, gas blowing into a gap between the wafer and the wafer receiving area, and a centrifugal force due to rotation of the turntable, and enables improved film uniformity.

A first aspect of the present invention provides a film deposition apparatus for depositing a film on a substrate by performing a cycle of alternately supplying at least two kinds of reaction gases that react with each other on the substrate to produce a layer of a reaction product in a vacuum chamber. This film deposition apparatus includes a turntable provided in the vacuum chamber; a substrate receiving portion in which a substrate is placed, the substrate receiving portion being provided in the turntable; a first reaction gas supplying portion that supplies a first reaction gas to a surface where the substrate receiving portion is provided in the turntable; a second reaction gas supplying portion that supplies a second reaction gas to the surface where the substrate receiving portion is provided in the turntable, the second reaction gas supplying portion being away from the first reaction gas supplying portion in a rotation direction of the turntable; a separation area located between a first process area where the first reaction gas is supplied and a second process area where the second reaction gas is supplied, thereby separating atmospheres of the first process area and the second process area; a center area that is located at substantially a center of the vacuum chamber and has an ejection hole through which a separation gas is ejected to the surface where the substrate receiving portion is provided in the turntable, thereby separating the atmospheres of the first process area and the second process area; a transfer mechanism that transfers the substrate to and from the turntable in the vacuum chamber; a locking member that locks a part of an upper surface of the substrate in order to keep the substrate in the substrate receiving portion of the turntable; and an elevation mechanism that moves the locking member and the substrate upward and downward from the turntable.

A second aspect of the present invention provides a film deposition apparatus for depositing a thin film on a substrate by placing plural substrates in corresponding plural concave portions that are provided in an upper surface of a turntable and along a circle concentric to the turntable, and rotating the turntable to alternately expose the plural substrates to different reaction gases supplied to corresponding process areas. The film deposition apparatus includes plural reaction gas supplying portions that are provided away from ceilings of the corresponding process areas, and supply corresponding reaction gases toward the substrate; an inert gas supplying portion that supplies an inert gas to a separation area provided between the process areas; at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to the corresponding one of the process areas and the separation gas supplied to the separation area by way of the corresponding one of the process areas; and locking members provided in or around the corresponding concave portions of the turntable in order to keep the substrate in the concave portion.

A third aspect of the present invention provides a film deposition apparatus for depositing a thin film on an upper surface of a substrate by placing plural substrates in corresponding plural concave portions provided in an upper surface of a turntable, and rotating the turntable to alternately expose the plural substrates to different reaction gases supplied to corresponding process areas. The film deposition apparatus includes plural reaction gas supplying portions that are provided away from ceilings of the corresponding process areas, and supply corresponding reaction gases toward the substrate; an inert gas supplying portion that supplies an inert gas to a separation area provided between the process areas; at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to corresponding one of the process areas and the separation gas supplied to the separation area by way of the corresponding one of the process areas; locking members that are provided in or around the corresponding concave portions of the turntable and lock upper surfaces of the substrates placed in the concave portions; and a control portion that enables placing the substrates in the concave portions so that centers of the substrates deviate from centers of the concave portions, before rotating the turntable.

A fourth aspect of the present invention provides a film deposition apparatus for depositing a thin film on an upper surface of a substrate by placing plural substrates in corresponding plural concave portions provided in an upper surface of a turntable, and rotating the turntable to alternately expose the plural substrates to different reaction gases supplied to corresponding process areas. The film deposition apparatus includes plural reaction gas supplying portions that are provided away from ceilings of the process areas, and supply corresponding reaction gases toward the substrate; an inert gas supplying portion that supplies an inert gas to a separation area provided between the process areas; at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to corresponding one of the process areas and the separation gas supplied to the separation area by way of the corresponding one of the process areas; and locking members that are provided in or around the corresponding concave portions of the turntable and lock the substrates by contacting upper circumferential portions of the substrates, thereby keeping the substrates in the concave portions.

A fifth aspect of the present invention provides a film deposition apparatus for depositing a thin film on an upper surface of a substrate by placing plural substrates in corresponding plural concave portions provided in an upper surface of a turntable, and rotating the turntable to alternately expose the plural substrates to different reaction gases supplied to corresponding process areas. The film deposition apparatus includes plural reaction gas supplying portions that are provided away from ceilings of the corresponding process areas, and supply corresponding reaction gases toward the substrate; a first inert gas supplying portion that supplies an inert gas to a separation area provided between the process areas; a second inert gas supplying portion that supplies an inert gas from a center portion of the vacuum chamber; at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to the corresponding one of the process areas, the inert gas supplied from the first inert gas supplying portion to the separation area, and the inert gas supplied from the center area, by way of the corresponding one of the process areas; and locking members that are provided in or around the corresponding concave portions and lock upper surfaces of the substrates in the concave portions.

A sixth aspect of the present invention provides a film deposition method for depositing a film on a substrate by carrying out plural cycles of alternately supplying at least two kinds of reaction gases that react with each other on the substrate to produce a layer of a reaction product in a vacuum chamber. The film deposition method includes steps of: transferring the substrate into the vacuum chamber through a transfer opening formed in the vacuum chamber, and placing the substrate in a substrate receiving portion of a turntable in the vacuum chamber so that the substrate is placed in an outermost position with respect to a center of the turntable; rotating the turntable; and depositing a film on the substrate by supplying a first reaction gas from a first reaction gas supplying portion toward a surface where the substrate receiving portion is formed in the turntable, supplying a second reaction gas from a second reaction gas supplying portion located away from the first reaction gas supplying portion, toward the surface where the substrate receiving portion is formed in the turntable, and supplying a separation gas from a separation area located between the first reaction gas supplying portion and the second reaction gas supplying portion.

A seventh aspect of the present invention provides a film deposition method for depositing a film on a substrate by carrying out a cycle of alternately supplying at least two kinds of reaction gases that react with each other on the substrate to produce a layer of a reaction product in a vacuum chamber. The film deposition method includes steps of: transferring the substrate into the vacuum chamber through a transfer opening formed, in the vacuum chamber and placing the substrate on lift pins provided in a substrate receiving portion having a concave shape in a turntable in order to place the substrate in the substrate receiving portion; moving the lift pins downward so that the substrate is moved downward below an upper surface of the turntable; moving the lift pins horizontally outward in a radius direction of the turntable so that an outmost part of the substrate contacts or is positioned close to an inner circumferential surface of the substrate receiving portion; moving the lift pins further downward so that the substrate is placed on a bottom surface of the substrate receiving portion; rotating the turntable; and depositing a film on the substrate by supplying a first reaction gas from a first reaction gas supplying portion toward a surface where the substrate receiving portion is formed in the turntable, supplying a second reaction gas from a second reaction gas supplying portion located away from the first reaction gas supplying portion, toward the surface where the substrate receiving portion is formed in the turntable, and supplying a separation gas from a separation area located between the first reaction gas supplying portion and the second reaction gas supplying portion.

DETAILED DESCRIPTION OF THE PREFERRED EMBODIMENT

Figure 1:
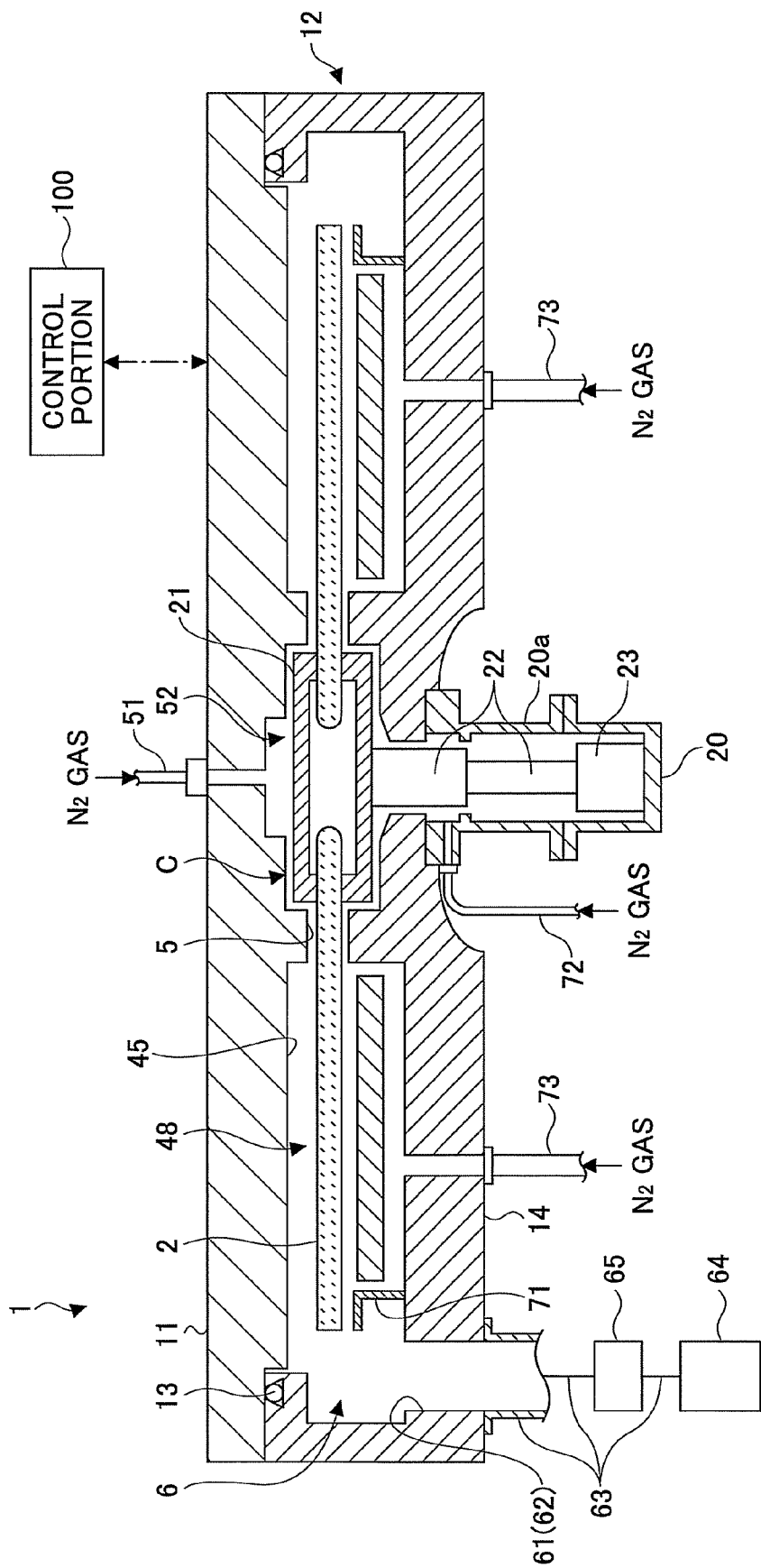
FIG. 1 is a cross-sectional view of a film deposition apparatus according to an embodiment of the present invention.

According to an embodiment of the present invention, a wafer placed in a wafer receiving area of a turntable is substantially prevented from being thrown outward from the wafer receiving area even when the turntable is rotated at relatively high rotation speed, and thus the wafer is substantially prevented from being broken or chipped.

In addition, according to an embodiment of the present invention, the wafer is substantially prevented from moving or vibrating in the concave portion, while such moving or vibrating may cause breakage and/or chipping of the wafer.

Therefore, particle generation is substantially avoided, and the ALD is carried out in a clean environment, thereby fully reducing contamination of the wafer and auto-doping of impurities into a film. As a result, the number of reject wafers can be reduced, thereby contributing to improved production yield.

A film deposition apparatus according to an embodiment of the present invention is provided with a vacuum chamber 1 having a flattened cylinder shape whose top view is substantially circle, and a turntable 2 that is located inside the vacuum chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a ceiling member such as an O ring 13, so that the vacuum chamber 1 is hermetically sealed. On the other hand, the ceiling plate 11 can be raised by a driving mechanism (not shown) when the ceiling plate 11 has to be removed from the chamber body 12.

The turntable 2 is supported at the center portion by a core portion 21 having a cylindrical shape, which is fixed on a top end of a rotational shaft 22 that extends in a vertical direction. The rotational shaft 22 goes through a bottom portion 14 of the chamber body 12, and is fixed at the lower end to a driving mechanism 23 that can rotate the rotational shaft 22 around a vertical axis in a clockwise direction in this embodiment. The rotational shaft 22 and the driving mechanism 23 are housed in a case body 20 having a cylinder with a bottom. The case body 20 is fixed in an air-tight manner to a bottom surface of the bottom portion 14 via a flanged portion 20a, so that an inner environment of the case body 20 is isolated from an outer environment.

Figure 2:
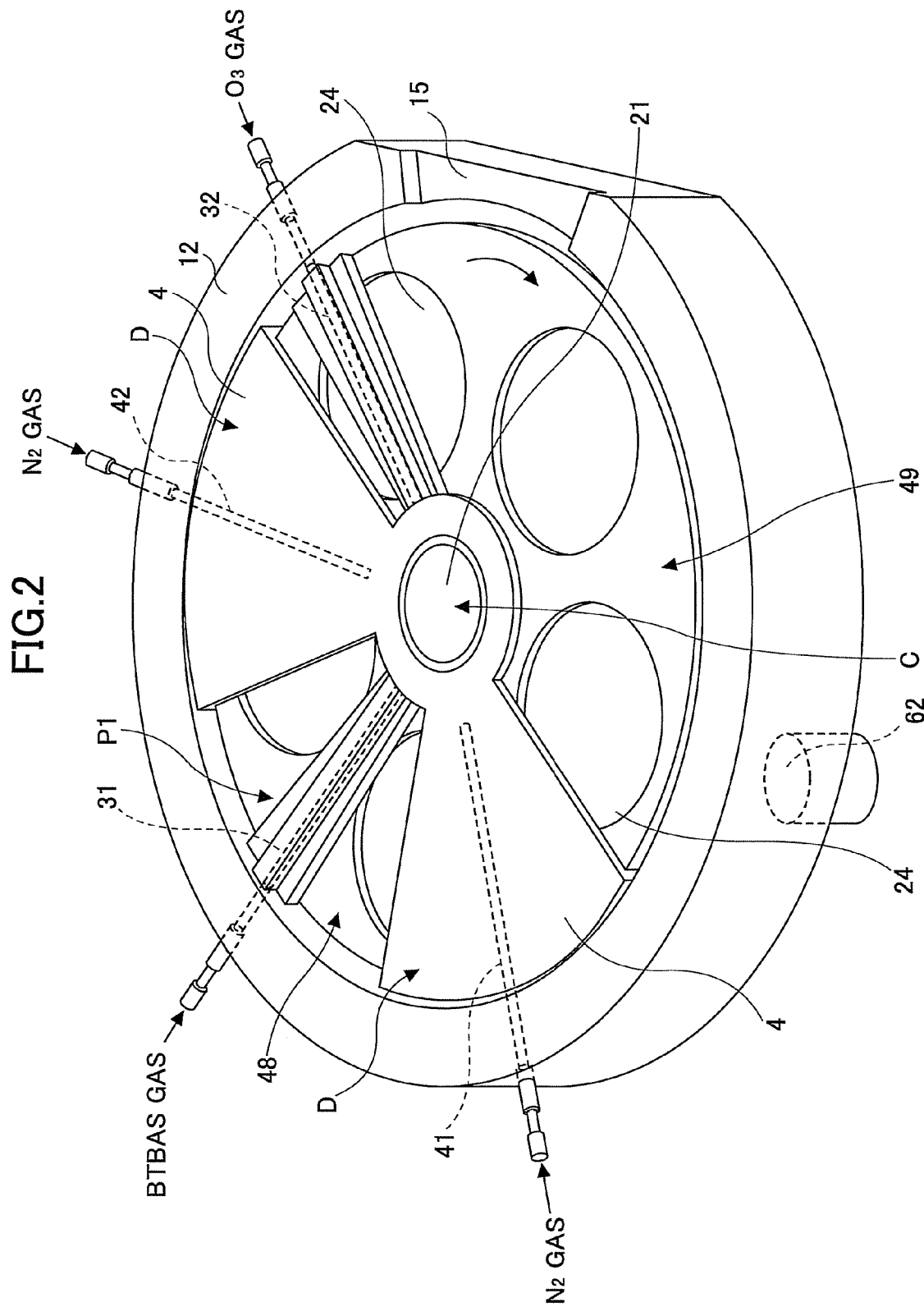
FIG. 2 is a perspective view illustrating an inner configuration of the film deposition apparatus.
Figure 3:
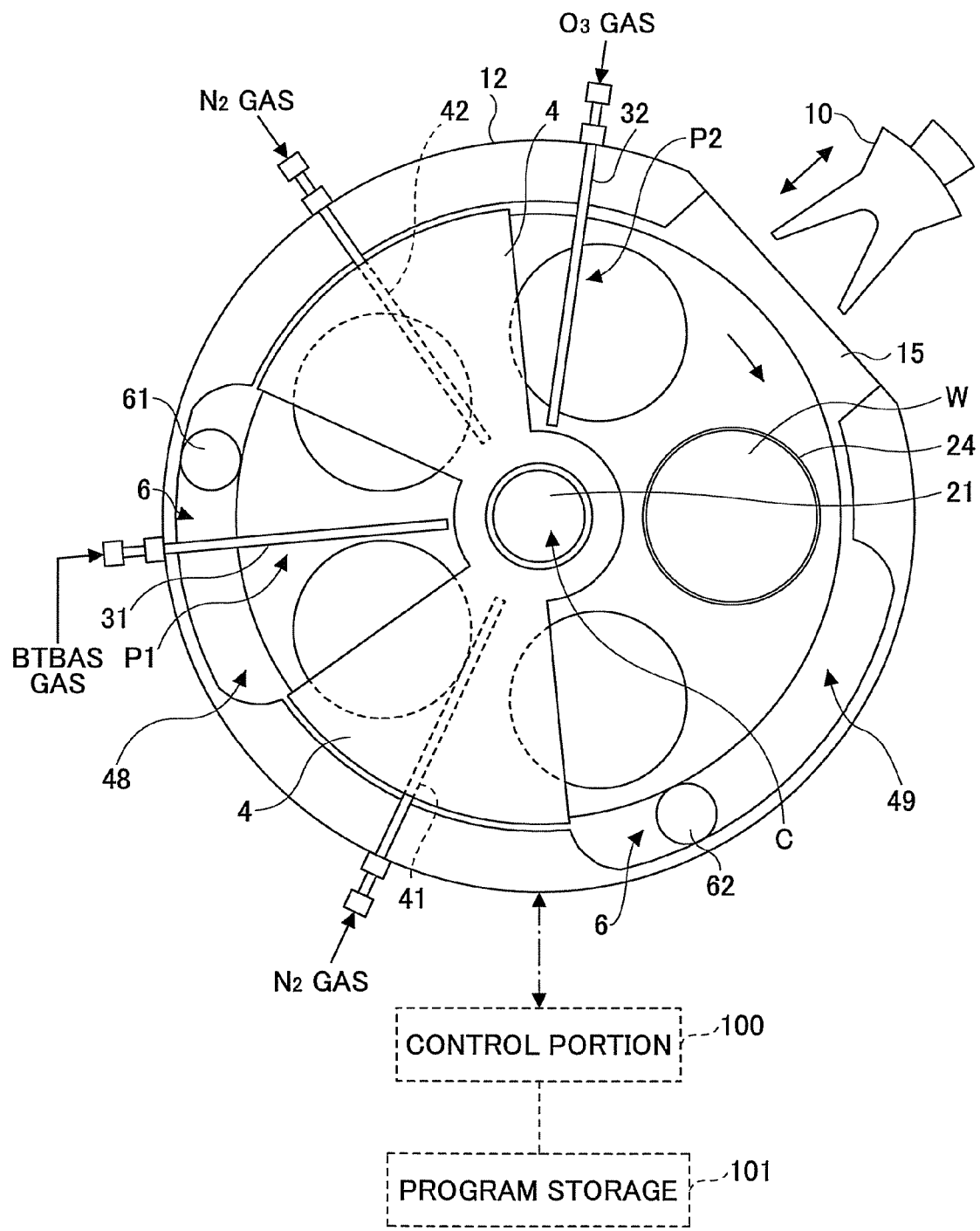
FIG. 3 is a plan view of the film deposition apparatus.
Figure 4:
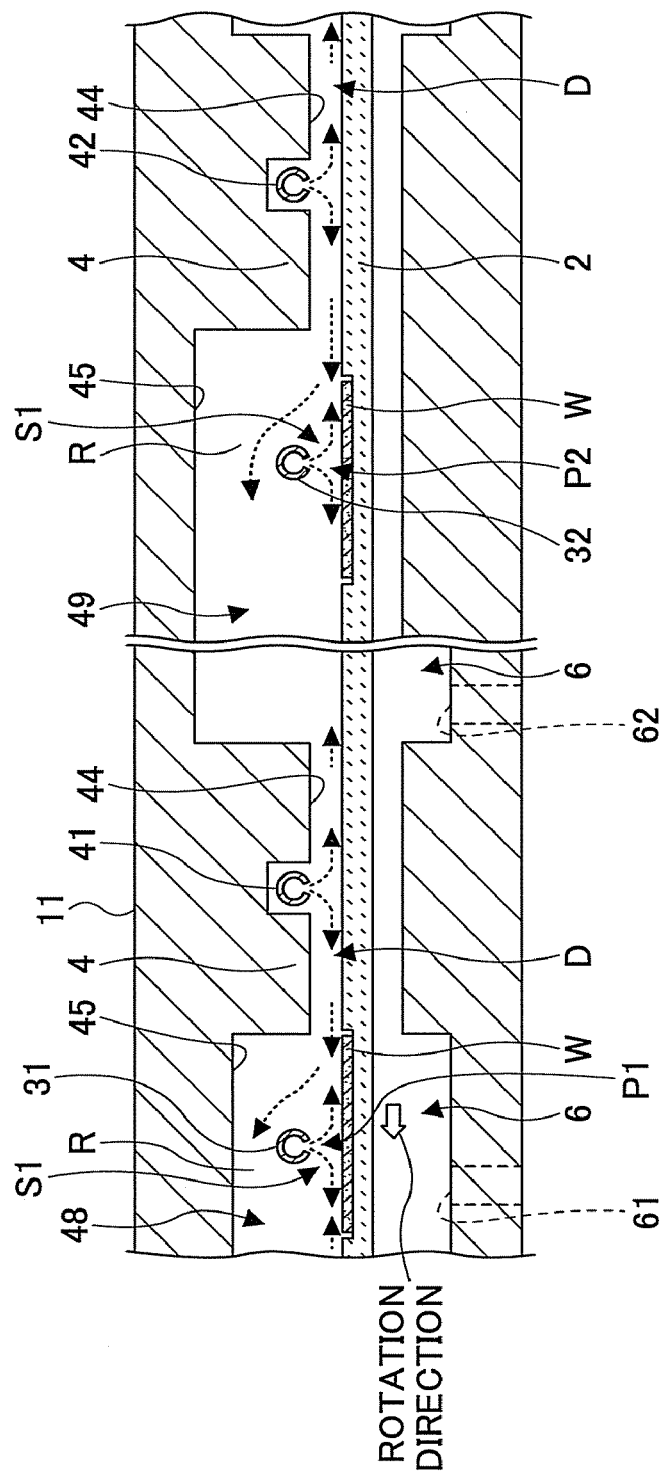
FIG. 4 is a cross-sectional view schematically illustrating process areas and a separation area of the film deposition apparatus.
Figure 6:
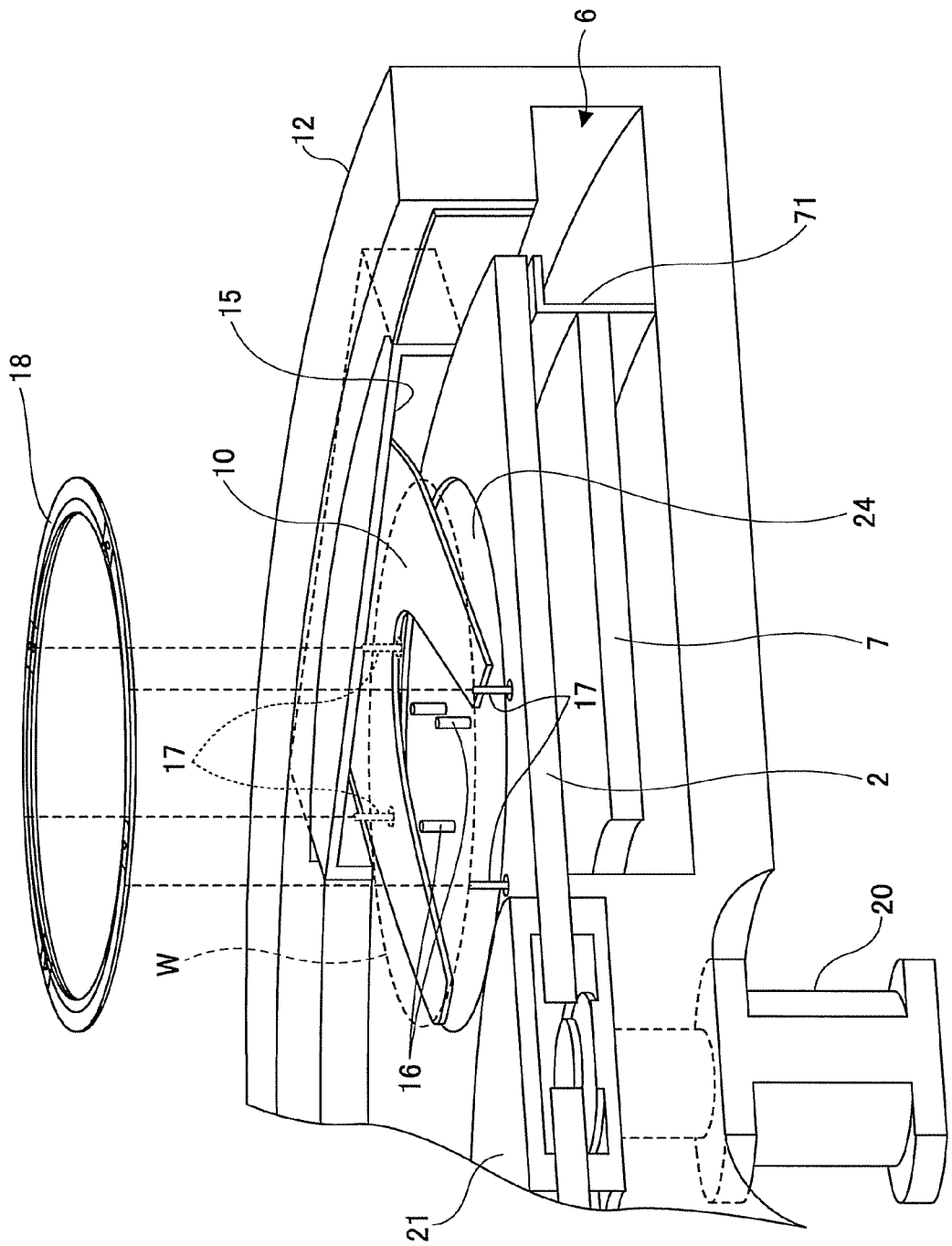
FIG. 6 is a cut-away perspective view of the film deposition apparatus.

As shown in FIGS. 2 and 3, plural (five in the illustrated example) circular concave portions 24, each of which receives a wafer W, are formed along a rotation direction (or circumferential direction) of the turntable 2 in the upper surface of the turntable 2, although only one wafer W is illustrated in FIG. 3, for convenience of illustration. FIG. 4 is a projected cross-sectional diagram taken along part of a circle concentric to the turntable 2. As shown in FIG. 4, the concave portion 24 where the wafer W is placed has a diameter slightly larger, for example, by 4 mm, than the diameter of the wafer W and a depth equal to a thickness of the wafer W. Therefore, when the wafer W is placed in the concave portion 24, a surface of the wafer W is at the same elevation of a surface of an area of the turntable 2, the area excluding the concave portions 24. If there is a relatively large step between the area and the wafer W, gas flow turbulence is caused by the step, which may affect thickness uniformity across the wafer W. This is why the two surfaces are at the same elevation. While "the same elevation" may mean here that a height difference is less than or equal to about 5 mm, the difference has to be as close to zero as possible to the extent allowed by machining accuracy. In the bottom of the concave portion 24 there are formed three through holes (not shown) through which three corresponding elevation pins (see FIG. 6) are raised/lowered. The elevation pins support a back surface of the wafer W and raise/lower the wafer W.

Figure 7:
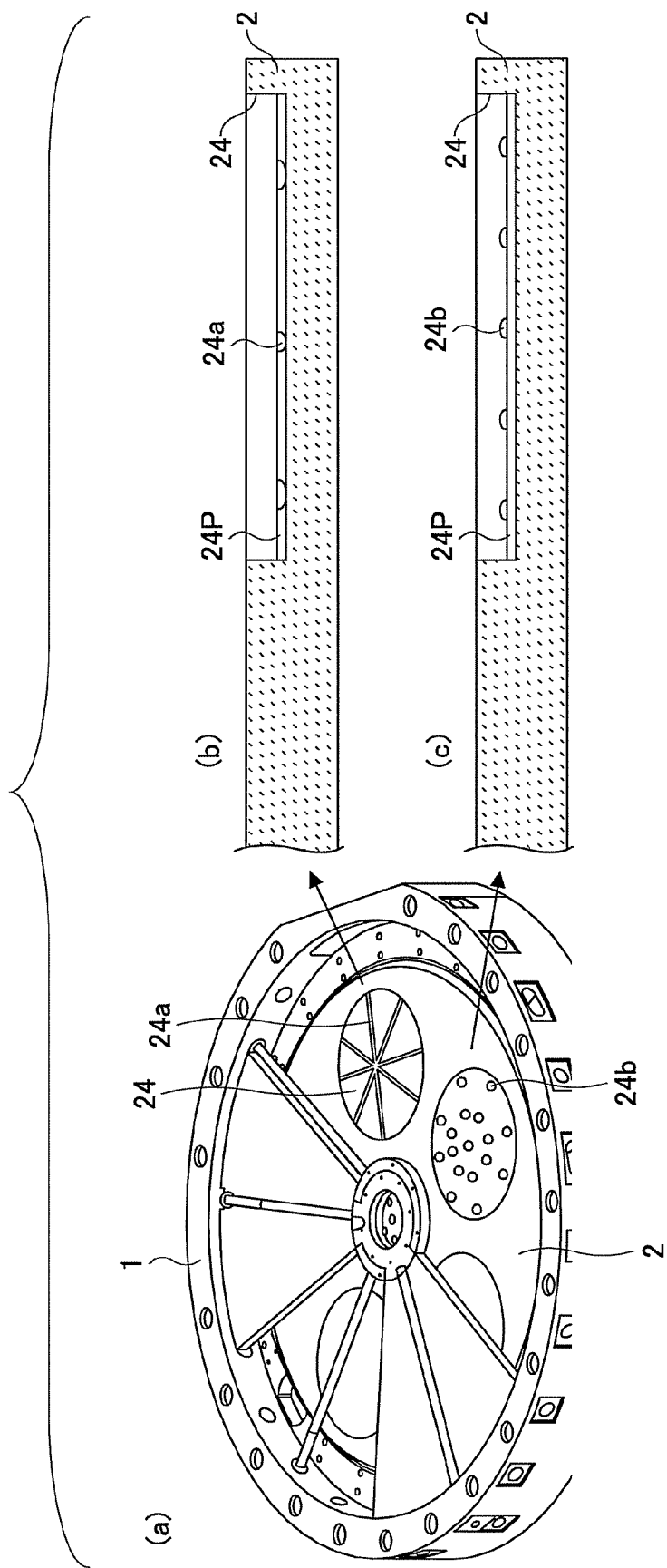
FIG. 7 illustrates a groove and a convex portion formed in a surface that contacts a back surface of a wafer.

When gas (e.g., reaction gases or separation gas) is jetted into a gap between an inner circumferential edge of the concave portion 24 and an outer circumferential edge of the wafer W, the wafer W may be made to float upward. In order to avoid such floating upward, a groove portion 24a extending in a radial direction may be formed at the upper surface (or bottom) of the concave portion 24, as shown in Section (a) of FIG. 7. In this case, the gas jetted into the gap between the inner circumferential edge of the concave portion 24 and the outer circumferential edge of the wafer W can be released through the groove portion 24a, and thus the wafer W is less likely to float upward. In addition, island portions 24b may be formed in the bottom of the concave portion 24 in order to provide an air path below the wafer W placed in the concave portion 24, instead of the groove portion 24a, as shown in Section (a) of FIG. 7.

Incidentally, the groove portions 24a and/or island portions 24b may be formed in a plate (or pedestal) 24P, which in turn is placed in the concave portion 24, instead of forming the groove portions 24a and/or the island portions 24b in the bottom of the concave portion 24.

The concave portions 24 serve as wafer receiving areas provided to position the wafers W and prevent the wafers W from being thrown outward by centrifugal force caused by rotation of the turntable 2. However, the wafer receiving areas are not limited to the concave portions 24, but may be realized by guide members that are located at predetermined angular intervals on the turntable 2 to hold the edges of the wafers W.

Figure 8:
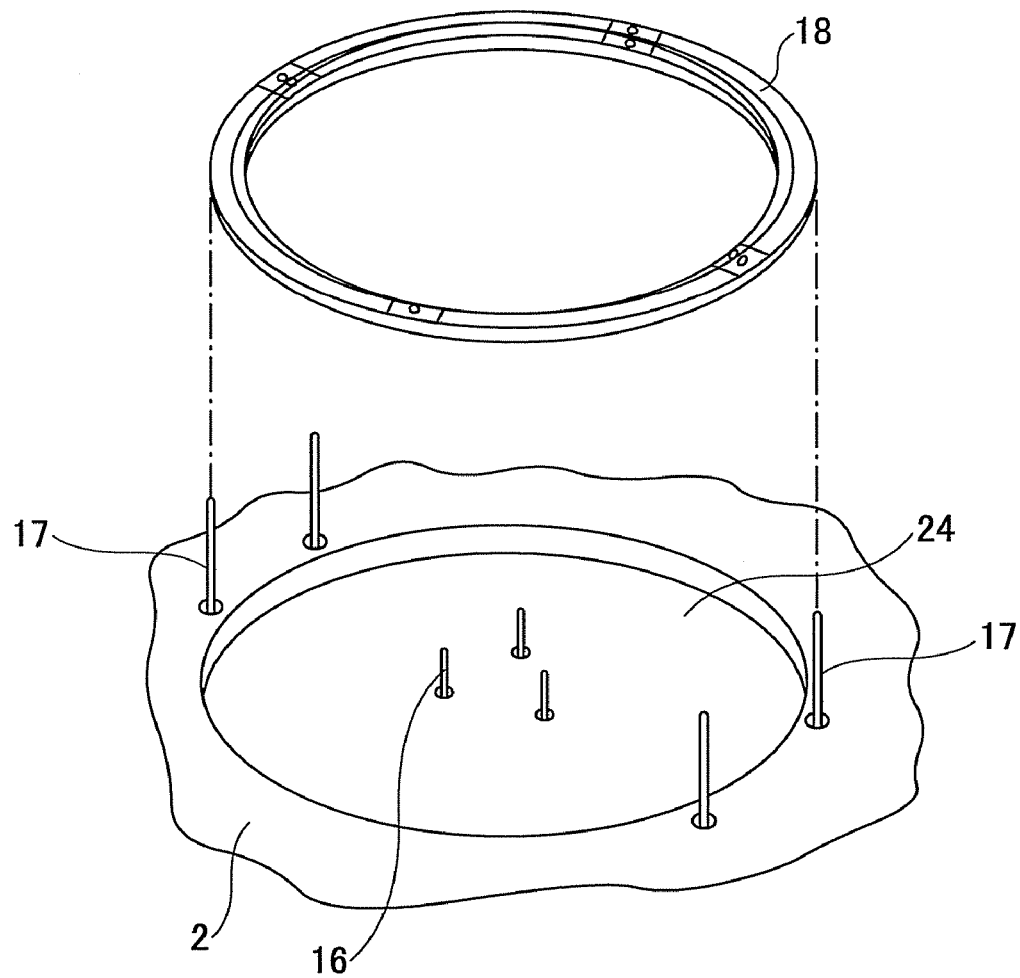
FIG. 8 is a schematic view of lift pins for a wafer and other lift pins for a clamp ring.

In the turntable 2, three through holes 16a through which three lift pins 16 for the wafer W are moved upward or downward are formed in each of the concave portions 24. In addition, four through holes 17a through which lift pins 17 for a clamp ring 18 are moved upward or downward are formed around each of the concave portions 24. FIG. 8 illustrates the concave portion 24 and its peripheral area, where the lift pins 16, the lift pins 17, and the clamp ring 18 are illustrated. The clamp ring 18 has a ring shape corresponding to the circular-shaped concave portion 24, and an inner diameter smaller than the outer diameter of the wafer W. In addition, the clamp ring 18 is placed on the upper circumferential portion of the wafer W in the concave portion 24 when being brought down by the lift pins 17. Namely, the clamp ring 18 serves as a locking member that substantially prevents the wafer W from being thrown away by centrifugal force due to the rotation of the turntable 2. Incidentally, the clamp ring 18 may be placed in the concave portion 24 so that part of the lower surface of the clamp ring 18 extends over the upper circumferential portion of the wafer W without being in contact with the wafer W.

Figure 9:
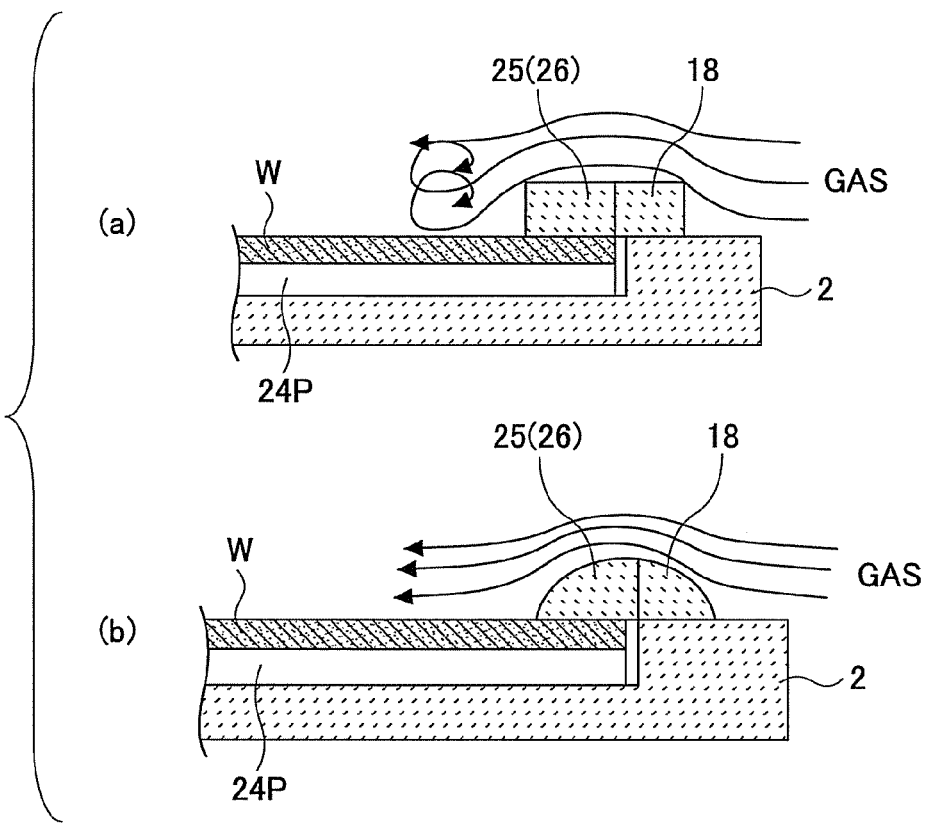
FIG. 9 is a cross-sectional view of the clamp ring.
Figure 10:
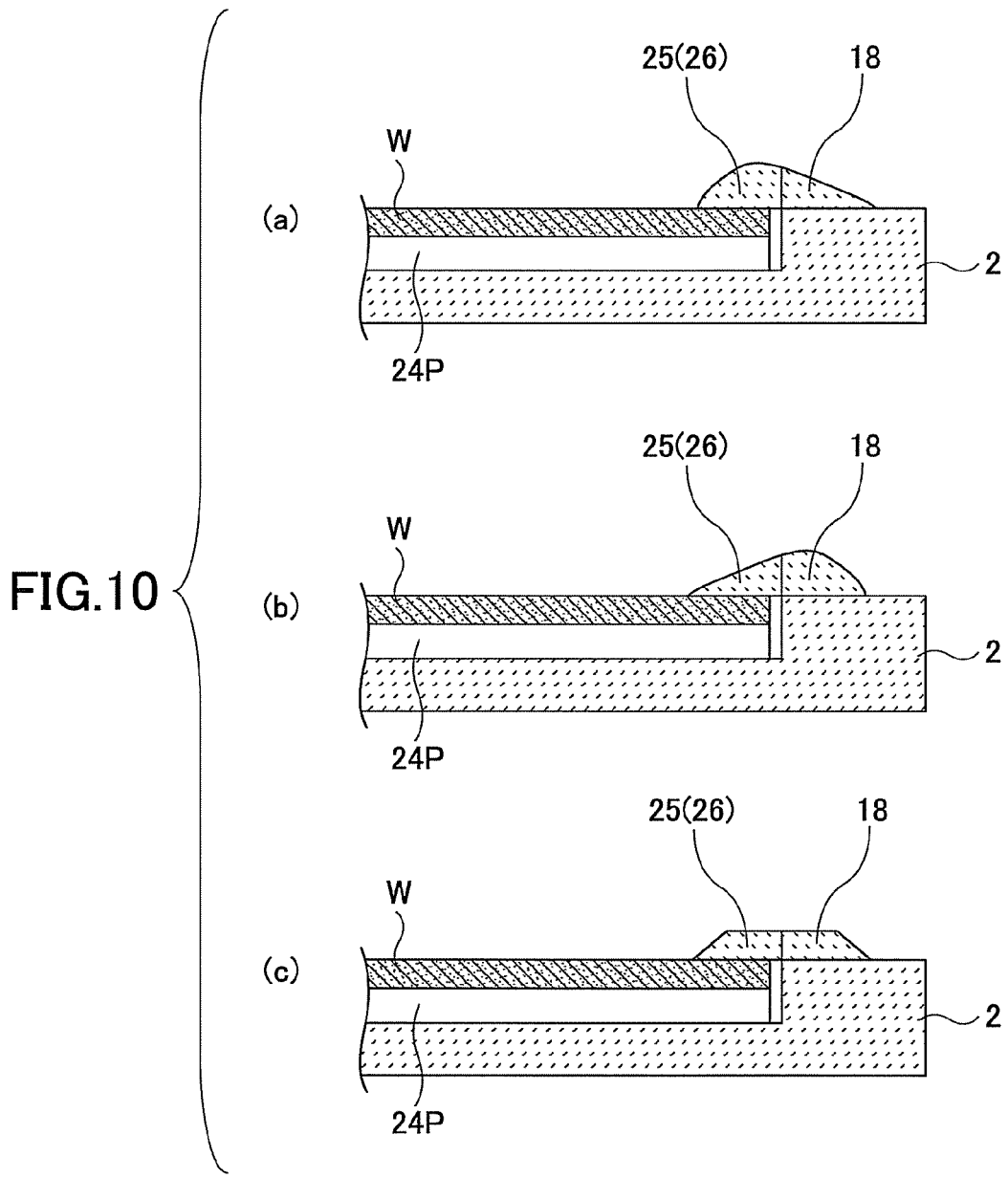
FIG. 10 illustrates another example of the clamp ring.

The clamp ring 18 may have the configuration shown in Section (a) of FIG. 9, but preferably has an arc-shaped cross section so that the reaction gas and the separation gas flowing over the turntable 2 cannot be disturbed by the clamp ring 18, as shown in Section (b) of FIG. 9. FIG. 10 illustrates other shapes of the clamp rings having different arc (or round) shapes. A cross-sectional shape of the clamp ring 18 may be chosen from those illustrated in FIGS. 9 and 10, depending on the gases to be used.

Figure 11:
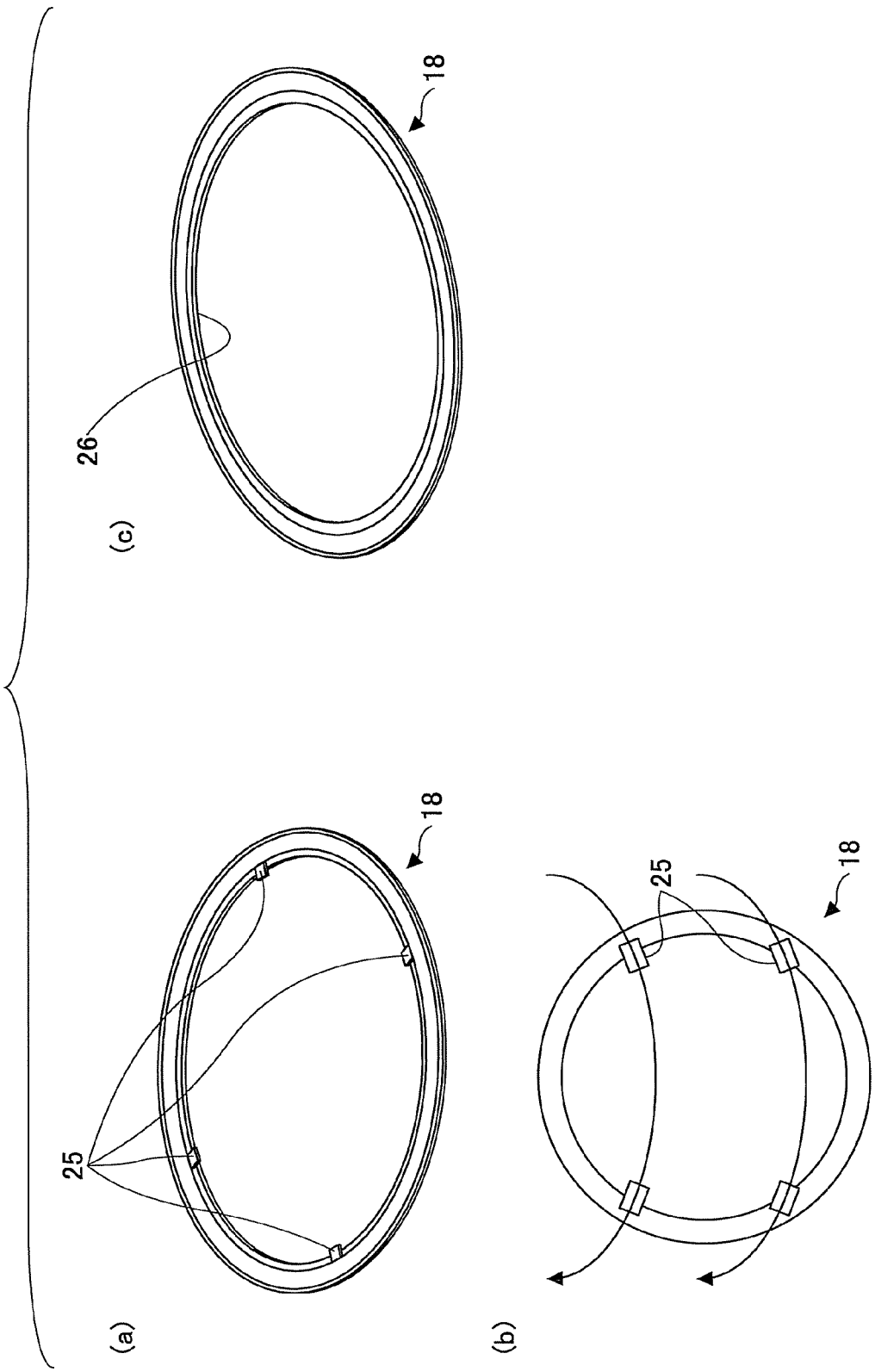
FIG. 11 is a schematic view of the clamp ring and a claw portion of the clamp ring.

In addition, the clamp ring 18 may have a different configuration, as long as the wafer W in the concave portion 24 is substantially prevented from being removed by pressure difference in the vacuum chamber 1 and by centrifugal force due to the rotation of the turntable 2. For example, the clamp ring 18 may have an inner diameter greater than the diameter of the wafer W (for example, 300 mm+1 through 5 mm) and claw portions 25 that protrude in an inner direction from the clamp ring 18, as shown in Section (a) of FIG. 11. With this configuration, the upper circumferential portion of the wafer W is clamped by the claw portions 25. In addition, the claw portions 25 may be arranged along a circle concentric to the turntable 2 (or along an arrow shown in the drawing), as shown in Section (b) of FIG. 11, so that an influence caused on a flow of the gases in the vacuum chamber 1 by the claw portions 25 is reduced. In addition, each of the claw portions 25 may be curved along the circle concentric to the turntable 2. Moreover, the clamp ring 18 may have a brim-shaped portion 26 that extends in an inner direction from the inner circumferential edge of the clamp ring 18, thereby covering the upper circumferential portion of the wafer W, instead of the claw portion 25. This clamp ring 18 is advantageous in that the gas is less likely to flow through the gap between the wafer W and the inner circumferential edge of the concave portion 24, thereby substantially preventing a film from being deposited on the lower surface of the wafer W. A shape of the clamp ring 18 having the brim-shaped portion may be optionally determined depending on the reaction gases to be used.

Figure 12:
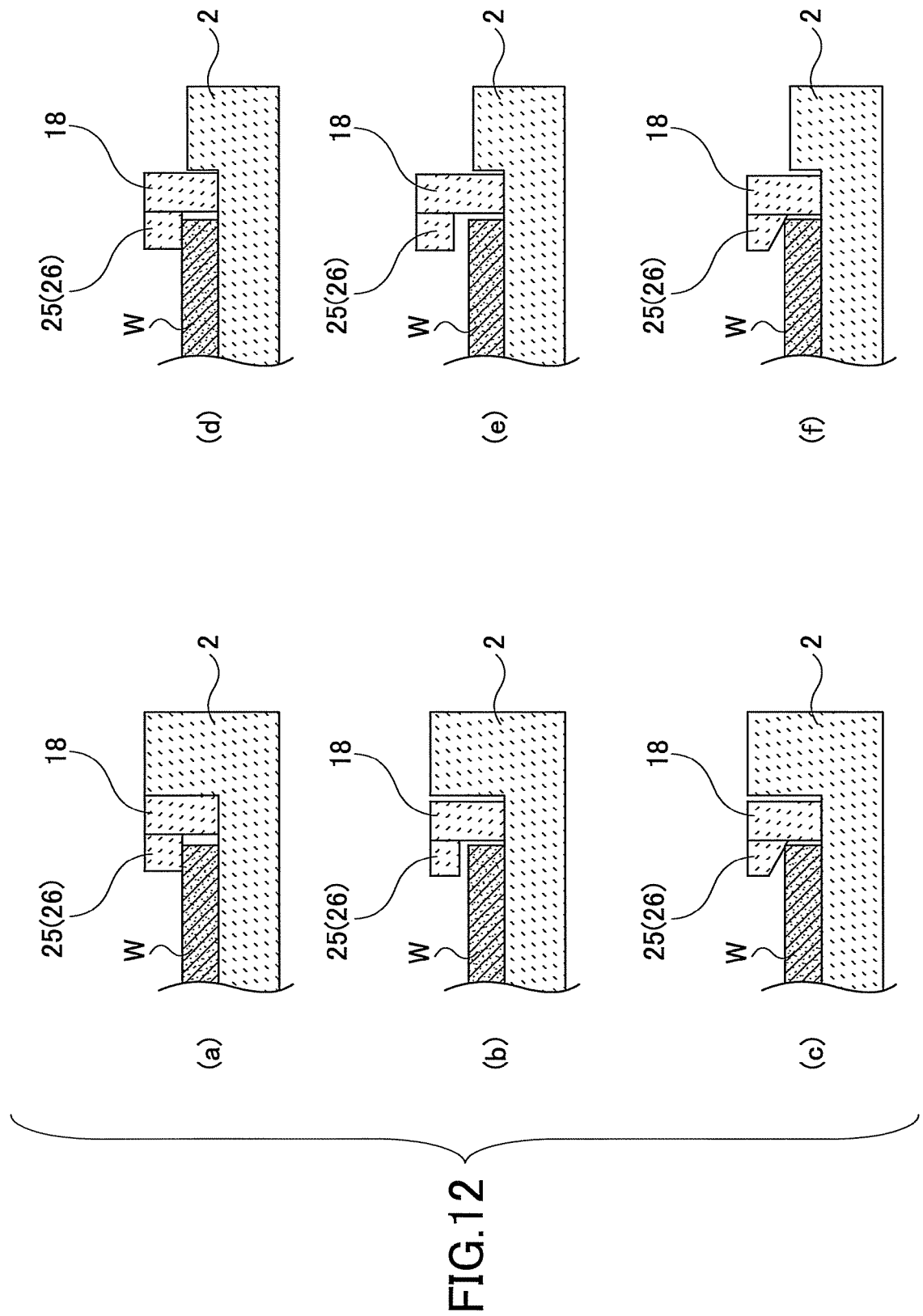
FIG. 12 schematically illustrates a positional relationship between the clamp ring, the wafer, and the turntable.

Next, other various shapes of the clamp rings 18 are explained with reference to FIG. 12. Sections (a) through (c) illustrate cross-sectional views of the clamp rings 18 that are placed in the concave portion 24, where the upper surface of the turntable 2 and the upper surface of the clamp ring 18 form one face. The clamp ring 18 shown in Section (a) of FIG. 12 has the claw portion 25 or the brim-shaped portion 26 of which a lower surface contacts the upper circumferential portion of the wafer W. The clamp ring 18 shown in Section (b) of FIG. 12 has the claw portion 25 or the brim-shaped portion 26 of which a lower surface does not contact the upper circumferential portion of the wafer W. The clamp ring 18 shown in Section (c) of FIG. 12 has the claw portion 25 or the brim-shaped portion 26 of which a lower surface is slanted down toward the outer edge of the wafer W, so that the claw portion 25 or the brim-shaped portion 26 tangentially contacts the wafer W.

Sections (d) through (f) illustrate cross-sectional views of the clamp rings 18, where the upper surface of the clamp ring 18 is higher than the upper surface of the turntable 2 that is at the same elevation as the upper surface of the wafer W. The clamp ring 18 shown in Section (d) of FIG. 12 has the claw portion 25 or the brim-shaped portion 26 of which a lower surface contacts the upper circumferential portion of the wafer W. The clamp ring 18 shown in Section (e) of FIG. 12 has the claw portion 25 or the brim-shaped portion 26 of which a lower surface does not contact the upper circumferential portion of the wafer W. The clamp ring 18 shown in Section (f) of FIG. 12 has the claw portion 25 or the brim-shaped portion 26 of which a lower surface is slanted down toward the outer edge of the wafer W, so that the claw portion 25 or the brim-shaped portion 26 tangentially contacts the wafer W.

Figure 5:
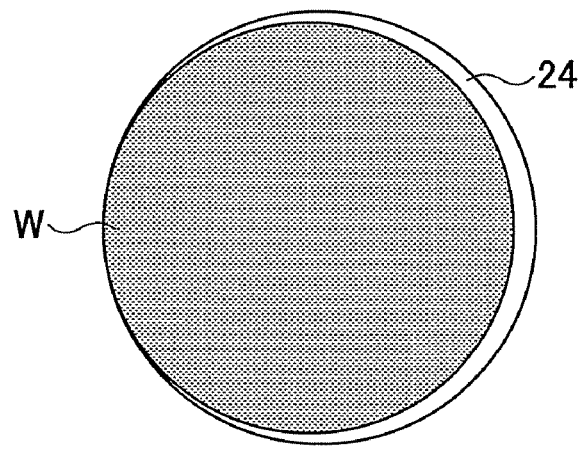
FIG. 5 is a schematic view illustrating a difference in diameter between a wafer and a wafer receiving area of a turntable of the film deposition apparatus.

Referring again to FIGS. 2, 3, and 5, a transfer opening 15 is formed in the circumferential wall of the chamber body 12. The wafer W is transferred into or out from the vacuum chamber 1 through the transfer opening 15 by a transfer arm 10 arranged outside of the vacuum chamber 1. Because the wafer W is transferred into the chamber 1 and placed in the concave portion 24 from the transfer arm 10 when the concave portion 24 of the turntable 2 is in alignment with the transfer opening 15, a driving portion 19 (FIG. 13) that moves upward and downward the lift pins 16 (FIG. 6) through corresponding through holes (not shown) formed in the concave portion 24 of the turntable 2 is provided below the concave portion 24 in alignment with the transfer opening 15.

Figure 13:
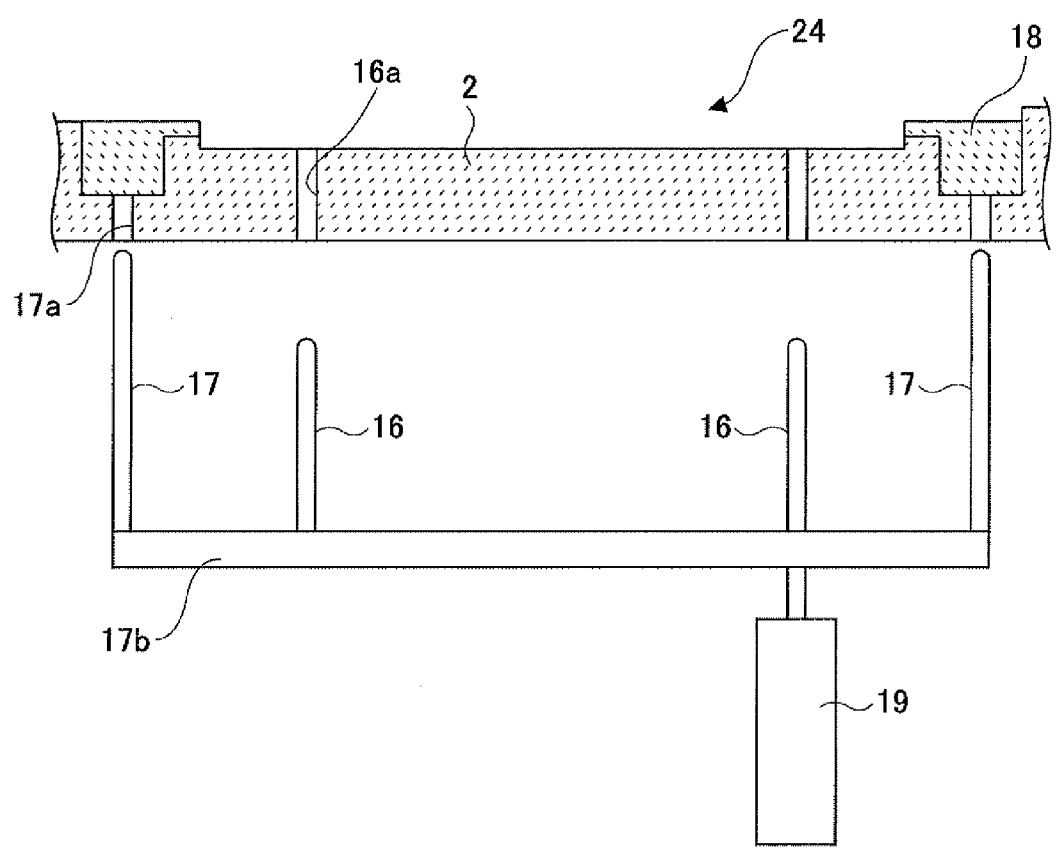
FIG. 13 is a cross-sectional view illustrating an elevation mechanism including the lift pins for the wafer and the other lift pins for the clamp ring.

In addition, the lift pins 17 for the clamp ring 18 are provided along with the lift pins 16 for the wafer W. The lift pins 17 move upward and downward through corresponding through holes formed around the concave portion 24, as shown in FIG. 8. Additionally, as shown in FIG. 13, the lift pins 17 for the clamp ring 18 have a greater length than the lift pins 16 for the wafer W and are fixed at their bottom ends on a lift pin driving bar 17b. Therefore, the lift pins 16, 17 are driven in unison by the driving portion 19.

Next, operations of (or method of using) the film deposition are explained. First, a gate valve (not shown) provided for the transfer opening 15 is opened, and a wafer W is transferred into the vacuum chamber 1 by the transfer arm 10 through the transfer opening 15. Then, the wafer W is placed on the concave portion 24 through cooperation of the transfer arm 10, the lift pins 16 for the wafer W, and the lift pins 17 for the clamp ring 18.

Figure 14:
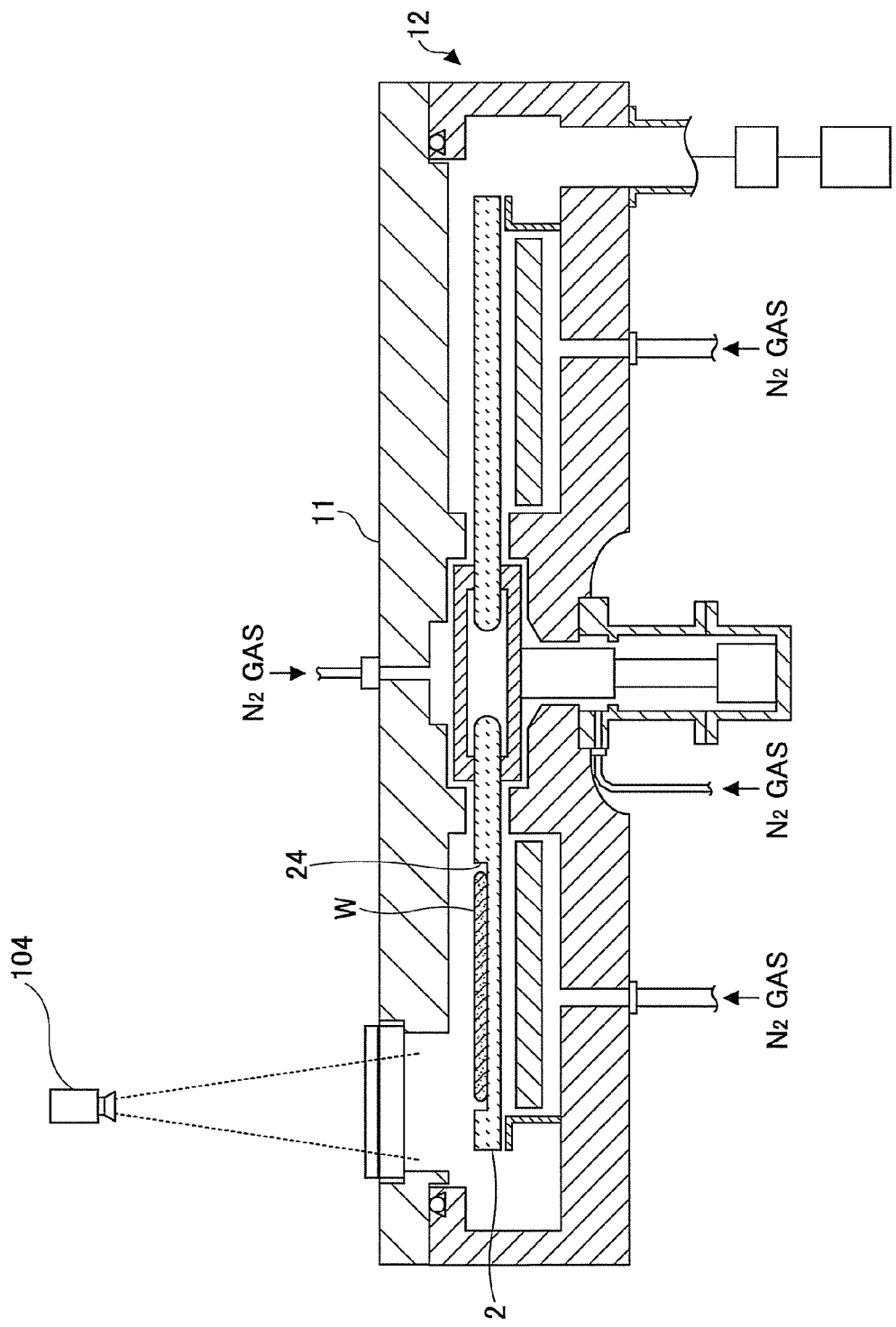
FIG. 14 schematically illustrates the film deposition apparatus and a position detection portion to be used to place the wafer eccentrically in the concave portion.

The wafer W used in the film deposition apparatus according to this embodiment has a diameter of 300 mm, and the concave portion 24 has an inner diameter of 304 mm. Namely, the concave portion 24 is larger than the wafer W by 4 mm. In this case, the wafer W may slide within the concave portion 24, and hit the inner circumferential wall of the concave portion 24 due to the centrifugal force generated by the rotation of the turntable 2, thereby generating particles. In order to avoid the particle generation, the wafer W should be placed in the concave portion 24 so that the edge of the wafer W contacts an outermost position of the circumferential wall of the concave portion 24, leaving a larger clearance between the edge of the wafer W and an innermost position of the circumferential wall of the concave portion 24. In other words, the wafer W should be outwardly eccentrically placed in the concave portion 24. A method of eccentrically placing the wafer is explained in the following. Before the wafer W is transferred from the transfer arm 10 to the lift pins 16, the circumferential edge of the concave portion 24 is detected by using a position detection portion including, for example, a charge coupled device (CCD) camera 104 (see FIG. 14), and data on a position of the circumferential edge are sent to and temporarily stored in a control portion 100 (FIG. 3). Incidentally, the CCD camera 104 is fixed above the vacuum chamber 1 and observes the concave portion 24 through a view port attached in the ceiling plate 11. Based on the stored data, a distance over which the transfer arm 10 moves in order to eccentrically place the wafer W in the concave portion 24 is calculated in the control portion 100. Specifically, the center of the concave portion 24 is determined based on the data on the position of the circumferential edge of the concave portion 24 on an XY coordinate plane defined on a pixel surface of the CCD camera 104. In a similar manner, the circumferential edge of the wafer W is detected, and data on the position of the circumferential edge of the wafer W are sent to and temporarily stored in the control portion 100. Then, the center of the wafer W is determined based on the data on the position of the circumferential edge of the wafer W. Based on the obtained centers of the concave portion 24 and the wafer W on the XY coordinate plane, the control portion 100 further calculates the distance over which the transfer arm 10 moves so that the edge of the wafer W contacts the outermost position of the inner circumferential wall of the concave portion 24.

In addition, the driving portion 19 shown in FIG. 13 can move the lift pins 16 for the wafer W and the lift pins 17 for the clamp ring 18 not only in the vertical direction but also in the horizontal direction, in accordance with control signals from the control portion 100. Therefore, the driving portion 19 can move the lift pins 16 holding the wafer W by the distance determined by the control portion 100, without moving the transfer arm 10 by the distance, and then move the lift pins 16 downward. With this, the wafer W is placed in the concave portion 24 so that the edge of the wafer W contacts the outermost position of the inner circumferential wall of the concave portion 24.

Alternatively, the transfer arm 10 holds the wafer W above the concave portion 24 so that the center of the wafer W is in vertical alignment with the center of the concave portion 24, under control of the control portion 100. In this case, after the lift pins 16 receive the wafer W from the transfer arm 10, the lift pins 16 may move a distance of, for example, 2 mm, and bring down the wafer W in the concave portion 24. Even with this, the wafer W is placed in the concave portion 24 so that the edge of the wafer W contacts the outermost position of the inner circumferential wall of the concave portion 24.

Incidentally, the lift pins 16 for the wafer W and the lift pins 17 for the clamp ring 18 may be attached on the lift pin driving bar 17b, and moved in unison via the lift pin driving bar 17b by the driving portion 19, as shown in FIG. 13. On the other hand, the lift pins 16 for the wafer W and the lift pins 17 for the clamp ring 18 may be separately moved by the driving portion 19. Alternately, the lift pins 16 for the wafer W and the lift pins 17 for the clamp ring 18 may be separately moved by corresponding driving portions.

Next, procedures of placing the wafer W in the concave portion 24 is explained with reference to FIGS. 15A and 15B.

Figure 15A:
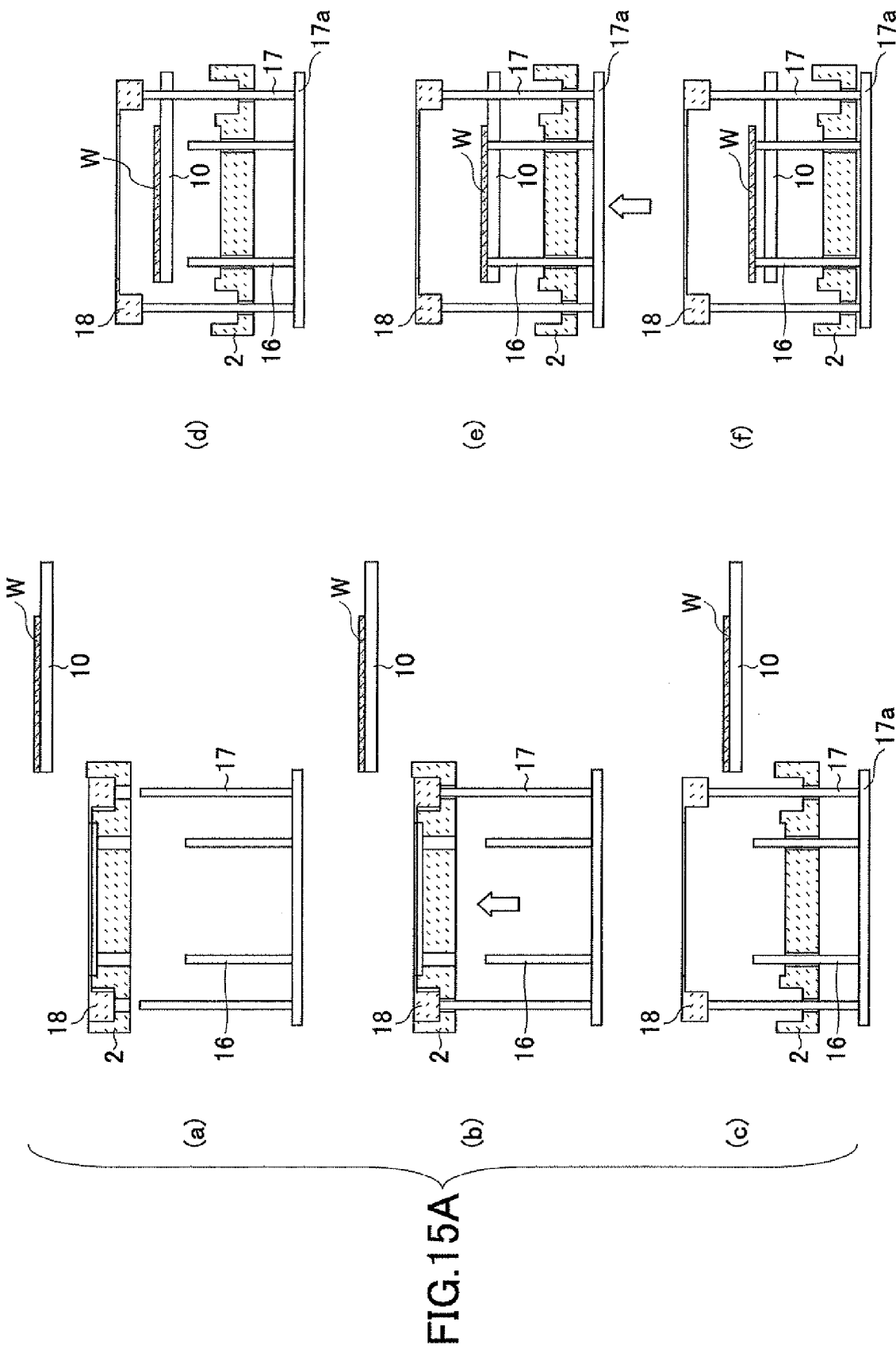
FIGS. 15A and 15B are side views illustrating a method of placing the wafer in the concave portion.

First, as shown in Section (a) of FIG. 15A, the turntable 2 is positioned so that the lift pins 16 for the wafer W and the lift pins 17 for the clamp ring 18 can move through the corresponding through holes 16a, 17a formed in the turntable 2. The wafer W shown in the drawing has been taken out from a wafer case (not shown) by the transfer arm 10.

As shown in Section (b) of FIG. 15A, the lift pins 17 for the clamp ring 18 are moved upward by the driving portion 19, go through the corresponding through holes 17a, and bring upward the clamp ring 18, as shown in Section (c) of FIG. 15A. At this time, the lift pins 16 for the wafer W are also moved upward and go through the corresponding through holes 16a. Next, the transfer arm 10 moves into a space between the clamp ring 18 and the upper ends of the lift pins 16 for the wafer W, and holds the wafer W in the space, as shown in Section (d) of FIG. 15A. Here, the transfer arm 10 horizontally (from right to left in the drawing) moved over the distance obtained by the CCD camera 104 and the control portion 100, so that the wafer W can be eccentrically placed in the concave portion 24 in the following procedures. Next, the lift pins 16 for the wafer W are further moved upward along with the clamp ring 18 and the lift pins 17, and move the wafer W upward from the transfer arm 10, as shown in Sections (e) and (f) of FIG. 15A.

Figure 15B:
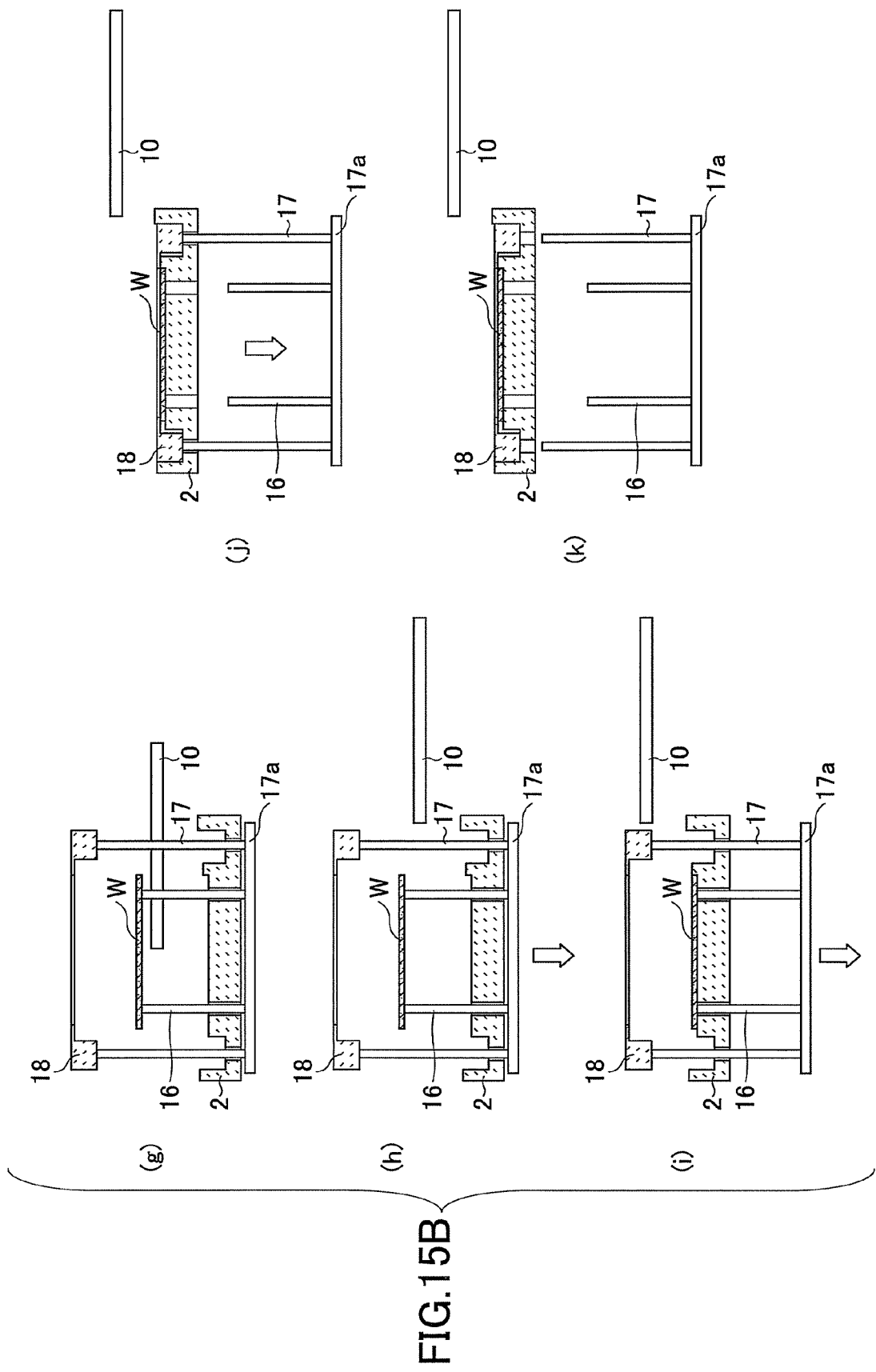

After the transfer arm 10 is withdrawn from a space between the clamp ring 18 and the turntable 2 as shown in Sections (g) and (h) of FIG. 15B, the lift pins 17 for the clamp ring 18 and the lift pins 16 for the wafer W start moving downward. With this, the wafer W is placed in the concave portion 24, as shown in Section (i) of FIG. 15B, and then the clamp ring 18 is placed on the turntable 2, as shown in Section (j) of FIG. 15B, so that the upper circumferential portion of the wafer W is locked by the clamp ring 18. After the lift pins 17 for the clamp ring 18 are moved further downward and are withdrawn from the corresponding through holes 17a, the turntable 2 becomes rotatable.

Because the outermost position of the wafer W in the radius direction of the turntable 2 contacts or is positioned close to the inner circumferential wall of the concave portion 24, the wafer W does not smash against the inner circumferential wall of the concave portion 24 even when the turntable 2 rotates at higher rotation speeds. Therefore, the wafer W is less likely to be broken or chipped, and thus particles that may be caused when the wafer W smashes against the inner circumferential wall of the concave portion 24 can be reduced. Accordingly, contamination of the vacuum chamber 1 caused from the particles and auto-doping of impurities into a film deposited on the wafer W can be avoided.

In addition, the film deposition apparatus according to this embodiment is provided with the control portion 100 that controls total operations of the deposition apparatus and is formed of, for example, a computer. A program storage 101 of the control portion 100 stores programs for operating the film deposition apparatus. The programs have groups of steps for carrying out the operations described later, for example. The programs may be stored in a computer readable storage medium such as a hard disk, a compact disc, a magneto optical disk, a memory card, or a flexible disk, and installed into the program storage 101.

Figure 16:
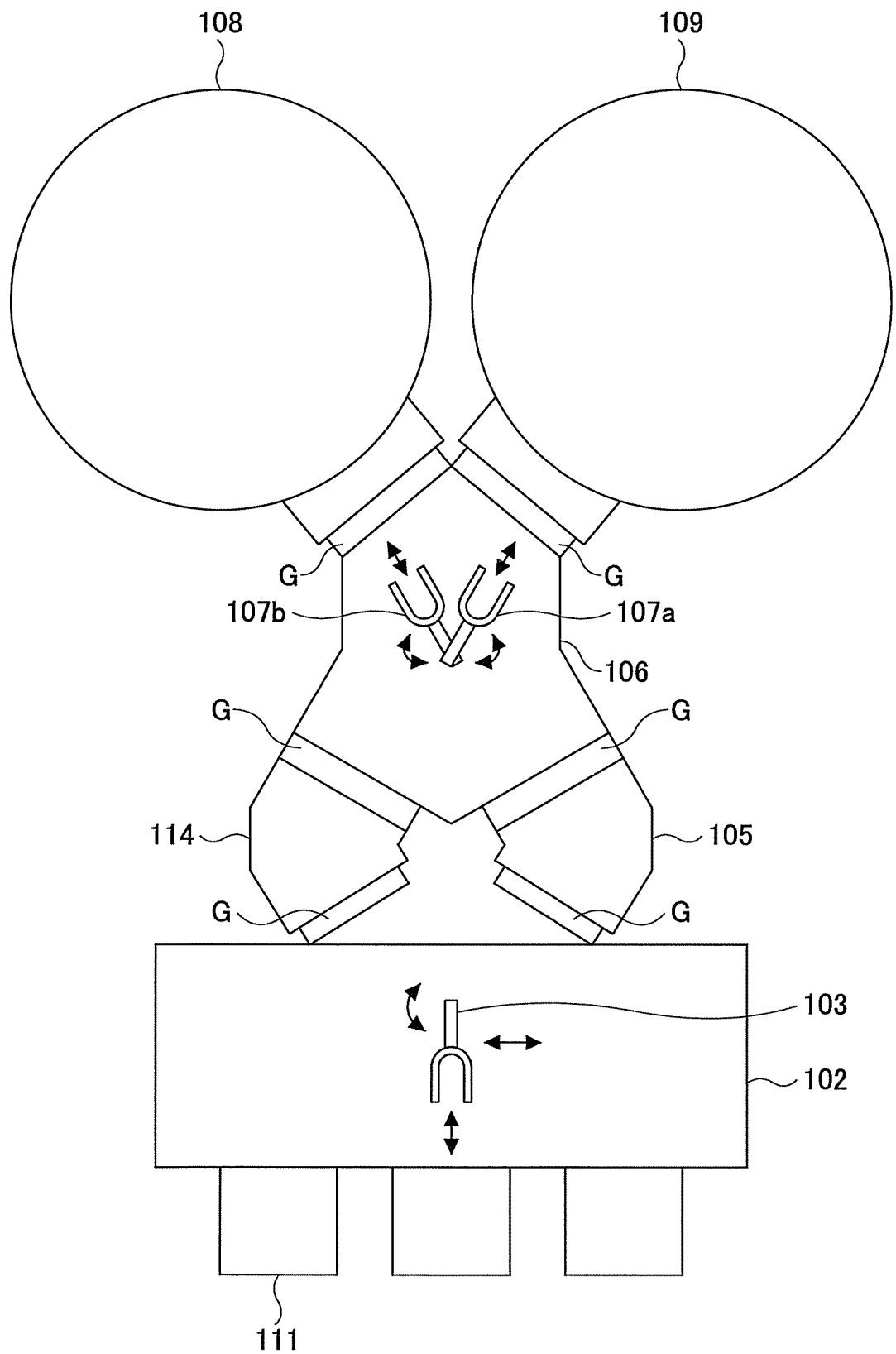
FIG. 16 is a plan view illustrating a wafer process system including the film deposition apparatus according to an embodiment of the present invention.

FIG. 16 illustrates a wafer process apparatus including the film deposition apparatus according to embodiments of the present invention. In FIG. 16, a reference symbol 111 represents an encapsulated type wafer carrier called a Front Opening Unified Pod (FOUP) that accommodates, for example, 25 wafers; a reference symbol 102 represents an atmospheric transfer chamber in which a transfer arm 103 is provided; reference symbols 114, 105 represent load lock chambers (preparation chambers) whose atmospheres are changeable between vacuum and atmospheric pressure; a reference symbol 106 is a vacuum transfer chamber in which two transfer arms 107a, 107b are provided; and reference symbols 108, 109 represent film deposition apparatuses according to embodiments of the present invention. After the wafer carrier 111 is transferred onto a transfer in/out port, and connected to the atmospheric transfer chamber 102, a lid of the wafer carrier 111 is removed by an opening/closing mechanism (not shown). A wafer is taken out from the wafer carrier 111 by the transfer arm 103. Next, the wafer is transferred to the load lock chamber 114 (or 105). After the load lock chamber 114 (or 105) is evacuated to vacuum, the wafer in the load lock chamber 114 (or 105) is transferred further to one of the film deposition apparatuses 108, 109 through the vacuum transfer chamber 106 by the transfer arm 107a (or 107b). In the film deposition apparatus 108 (or 109), a film is deposited on the wafer in such a manner as described above. Because the substrate process apparatus has two film deposition apparatuses 108, 109, each of which can accommodate five wafers at a time, the ALD (or MLD) mode deposition can be performed at high throughput.

In the film deposition apparatus according to the embodiment of the present invention, the wafer may be thrown out from the concave portion 24 due to the following reasons, which are explained with reference to FIG. 17, if the clamp ring 18 is not used.

As explained above, a flow rate of the BTBAS gas supplied to the process area 21 is about 100 sccm, a flow rate of the $O_3$ gas supplied to the process area P2 is 1 slm, a flow rate of each of the separation gases supplied from the separation gas nozzles 41, 42 to the corresponding separation areas D is about 10 slm, and a flow rate of the separation gas supplied from the center area C is about 10 slm. In addition, an inner pressure of the vacuum chamber 1 during deposition is about 8 Torr, and a rotation speed of the turntable 2 is about 240 rpm. In this case, the reaction gases and the separation gases flow as shown by arrows in FIG. 17. Because of the flow rate differences between the gases supplied respectively to the process area P1, the process area P2, and the separation areas D, the wafer W goes through relatively large pressure differences when the wafer W passes through the process area P1, the process area P2, and the separation areas D. With such large pressure differences, the wafer W may be thrown outward from the concave portion 24 when the clamp ring 18 is not used.

Figure 17:
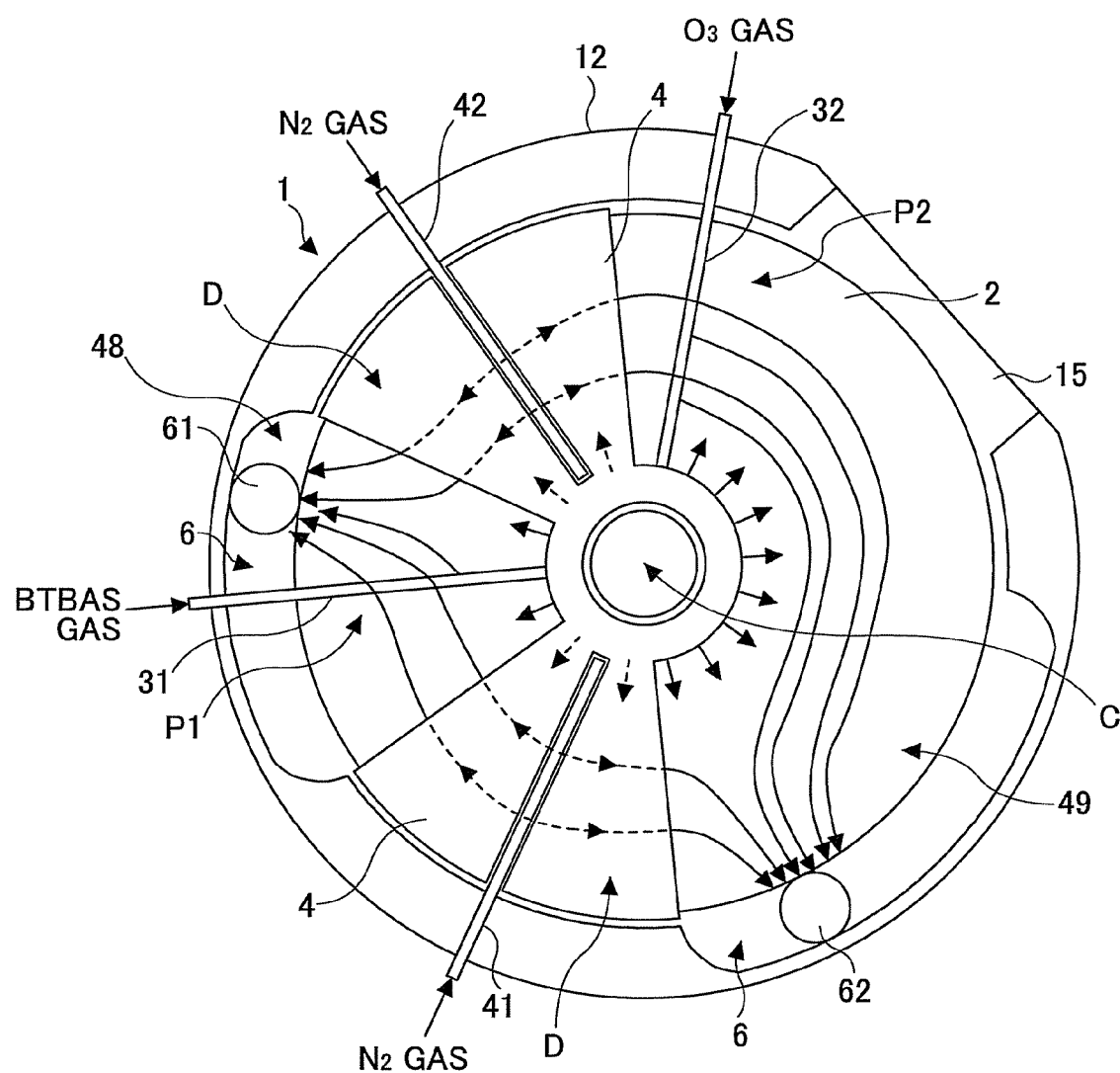
FIG. 17 illustrates a flow pattern of a first reaction gas, a second reaction gas, and a separation gas.

Referring to FIG. 17, advantages of the film deposition apparatus according to the embodiment of the present invention are explained.

As shown in the drawing, a diffusion area 48 including the process area P1 where a first reaction gas (e.g., BTBAS gas) and a diffusion area 49 including the process area P2 where a second reaction gas (e.g., $O_3$ gas) is supplied can be defined in the vacuum chamber 1. A size of the diffusion area 49 is twice the size of the diffusion area 48. Specifically, the diffusion area 49 has a center angle of about 180°. In addition, the reaction gas nozzle 32 is located in an upstream half of the diffusion area 49 relative to the rotation direction of the turntable 2, and the evacuation area 6 is located in a downstream half to the diffusion area 49. The evacuation port 62 is located in the evacuation area 6. With these configurations, the $O_3$ gas flows along with the separation gases supplied from the separation area D and the center area C in the diffusion area 49, and are evacuated through the evacuation port 62.

With such a flow pattern of the gases, the BTBAS gas supplied from the reaction gas nozzle 31 to the diffusion area 49, specifically the process area P1 is adsorbed on the wafer W that is held and rotated by the turntable 2. Next, when the wafer W enters and moves through the diffusion area 49, the BTBAS gas adsorbed on the upper surface of the wafer W is oxidized by the $O_3$ gas that flows in the above manner. As explained before, because the diffusion area 49 has the center angle of 180°, it takes a relatively long time for the wafer W to pass through the diffusion area 49. Therefore, the BTBAS gas adsorbed in the wafer W can be fully oxidized by the $O_3$ gas when the wafer W passes through the diffusion area 49. As a result, a film deposition rate per rotation can be increased. In other words, the larger diffusion area 49 provides an advantage of an increased film deposition rate, compared with a case where the diffusion area 49 has the same area as the diffusion area 48.

In FIG. 17, because the separation gas is supplied in a radial pattern into the process areas P1, P2 and the separation areas D from the center area C, as shown by solid arrows, no deposits are made on the core portion 21 existing in the center portion of the turntable 2 from the reaction gases supplied to the process areas P1, P2, and the rotation mechanism is not corroded by the reaction gases. Moreover, the separation gas supplied from the center area C reduces deposits on the inner wall of the vacuum chamber 1 from the reaction gases that are intermixed and react with each other in the vacuum chamber 1, along with the separation gas supplied from the separation areas D.

The BTBAS gas serving as a first reaction gas in the ALD process is supplied from the reaction gas nozzle 31 to the process area P1 in the vacuum chamber 1. Because the reaction gas nozzle 31 is introduced from the circumferential wall of the vacuum chamber 1 in a direction toward the center area C so that a larger space R (FIG. 4) is created between the reaction gas nozzle 31 and the ceiling surface 45 (FIG. 4) than a space below the reaction gas nozzle 31, the separation gas is likely to flow through the space, and is less likely to flow through a space below the reaction gas nozzle 31. Therefore, the separation gas that is supplied from the separation area D and flows into the diffusion area 48 can flow above the reaction gas nozzle 31 toward the evacuation port 61 in the evacuation area 6, which is located downstream relative to the rotation direction of the turntable 2 and close to the inner circumferential wall of the vacuum chamber 1. The two separation areas D are provided one on one side and the other on the other side of the reaction gas nozzle 31 (the process area P1).

Incidentally, the reaction gas nozzle 32 may be arranged in the same manner as the reaction gas nozzle 31.

The separation gas nozzles 41, 42 are provided at the centers of the corresponding separation areas D, and eject the $N_2$ gas, which is inert gas, toward the upper surface of the turntable 2. The N2 gas spreads in a thin space between the lower surface 44 (the lower surface of the convex portion 4) shown in FIG. 4 and the turntable 2 and flows toward the process areas P1, P2. Therefore, the reaction gases supplied to the corresponding process areas P1, P2 are impeded from flowing into the thin spaces in the separation areas D, and thus do not react with each other. In addition, a narrow space is created between the circumferential edge of the turntable 2 and the inner circumferential wall of the chamber body 12 at the outside of the separation areas D along the radius direction of the turntable 2. The narrow space is large enough for the turntable 2 to rotate without touching the inner circumferential wall of the chamber body 12, but does not serve as a gas passage. Moreover, because the evacuation port 61 is provided at the outside of the diffusion area 48 including the process area P1, and the evacuation port 62 is provided at the outside of the diffusion area 49 including the process area P2, the reaction gases supplied to the corresponding process areas P1, P2 are separately evacuated through the corresponding evacuation ports 61, 62, along with the separation gas (N2 gas) supplied from the separation gas nozzles 41, 42 and the center area C. Therefore, the reaction gases are fully separated. Incidentally, the flow of the reaction gases and the separation gases toward the corresponding evacuation ports 61, 62 is illustrated by solid arrows in FIG. 17. With such a flow pattern, the following three advantages are provided.

1. Because the reaction gases flow in a direction transverse to the longitudinal directions of the corresponding reaction gas nozzles 31, 32, even when the reaction gases supplied from the corresponding reaction gas nozzles 31, 32 are consumed on the upper surface of the wafer W, fresh reaction gases are continuously supplied to the upper surface of the wafer W. In other words, by-products caused, for example, by oxidization of the BTBAS gas with the $O_3$ gas flow away from the reaction gas nozzle 32 in a direction transverse to the longitudinal direction, so that the by-products do not impede the fresh reaction gas to reach the upper surface of the wafer W.

2. The reaction gases supplied to the corresponding process areas P1, P2 are impeded from flowing into the separation areas D (or the thin spaces between the lower surfaces of the convex portions 4 and the turntable 2), so that the reaction gases do not react with each other.

3. Because the $O_3$ gas supplied from the reaction gas nozzle 32 flows in the diffusion area 49 that is larger than the diffusion area 48, it takes more time for the $O_3$ gas to flow in the diffusion area 49, thereby sufficiently oxidizing the BTBAS gas adsorbed on the upper surface of the wafer W. Therefore, a relatively high film deposition rate can be obtained, compared with a case where the diffusion area 49 and the diffusion area 48 have the same area, even when the turntable is rotated at the same rotation speed in both cases.

As stated above, when the film deposition is carried out at a high rotation speed of, for example, 240 rpm, a relatively larger centrifugal force is applied to the wafer W in the concave portion 24, and thus the wafer W tends to move in the concave portion 24, to be lifted up, to vibrate, or to be thrown outward from the concave portion 24, compared with a case where the film deposition is carried out at, for example, 10 through 30 rpm. In order to determine a cause of such behavior of the wafer W the inventors of the invention of this application have observed the inside of the vacuum chamber 1 using the film deposition apparatus having a ceiling plate made of acrylic. As a result, it has been found that the wafer W goes through pressure differences when the wafer W comes from the separation area D to the process area P1 (or P2) in the vacuum chamber 1. In other words, the above behavior is caused not only by the centrifugal force due to the rotation of the turntable 2 but also by the pressure difference caused by differences in the flow rates of the gases supplied to the corresponding areas P1, P2, and D. Therefore, it has been concluded that the clamp ring 18 should be provided in or around the concave portion 24 in order to address such behavior of the wafer W due to various complex reasons.

As stated above, the BTBAS gas may be supplied at a flow rate of 100 sccm; the $O_3$ gas may be supplied at a flow rate of 10 slm; and the $N_2$ gas may be supplied at a flow rate of 10 slm from each of the separation gas nozzles 41, 42. In this situation, a relatively large flow rate of the N2 gas is supplied to the separation area D, specifically the thin space between the low ceiling surface 44 and the turntable 2, and thus a relatively large pressure difference is caused at a boundary between the separation area D and the diffusion area 48 including the process area P1 (or the diffusion area 49 including the process area P2). Such a relatively high pressure difference can be maintained by the thin space of the separation area D, which the N2 gas is supplied to, thereby separating the diffusion area 48 and the diffusion area 49. Such separation can be maintained even when the turntable 2 is rotated at 240 rpm.

In addition, the clamp ring 18 is provided in each of the concave portions 24 in order to impede the wafer W from floating upward because of the relatively large pressure difference. The clamp ring 18 may have the claw portions 25 or the brim-shaped portion 26, and take various shapes, depending on the shape of the claw portions 25 or the brim-shaped portion 26. For example, the claw portions 25 or the brim-shaped portion 26 of the clamp ring 18 may be streamlined, in order to reduce pneumatic resistance as much as possible. With such a shape, streaks, which may appear on the film deposited on the wafer W when the film deposition is carried out under viscous flow conditions, can be reduced.

Moreover, the wafer W is preferably placed to be eccentrically deviated toward the outermost position of the concave portion 24 in order to avoid the wafer W hitting the inner circumferential wall of the concave portion 24 due to the centrifugal force generated by the rotation of the turntable 24.

The film deposition apparatus according to embodiments of the present invention may be used to deposit silicon nitride in addition to silicon oxide. Moreover, the film deposition apparatus according to embodiments of the present invention is used for ALDs of aluminum oxide ($AL_2O_3$) using trymethylaluminum (TMA) and $O_3$ gas, zirconium oxide ($ZrO_2$) using tetrakis (ethylmethylamino) zirconium (TEMAZ) and $O_3$ gas, hafnium dioxide ($HfO_2$) using tetrakis (ethylmethylamino) hafnium (TEMAH) and $O_3$ gas, strontium oxide (SrO) using bis (tetra methyl heptandionate) strontium (Sr $(THD)_2$) and $O_3$ gas, titanium oxide (TiO) using (methylpentadionate) (bis-tetra-methyl-heptandionate) titanium (Ti (MPD) (THD)$_2$) and O$_3$ gas, or the like. In addition, oxide plasma may be used instead of O$_3$ gas. Even when these reaction gases are used, the above advantages and effects are provided.

Although the invention has been described in conjunction with the foregoing specific embodiment, many alternatives, variations and modifications within the scope of the appended claims will be apparent to those of ordinary skill in the art.

What is claimed is:

1. A film deposition apparatus for depositing a film on a substrate by performing a cycle of alternately supplying at least two kinds of reaction gases that react with each other on the substrate to produce a layer of a reaction product in a vacuum chamber, the film deposition apparatus comprising:
    a turntable provided in the vacuum chamber;
    a substrate receiving portion in which the substrate is placed, the substrate receiving portion being provided in the turntable;
    a first reaction gas supplying portion that supplies a first reaction gas to a surface where the substrate receiving portion is provided in the turntable;
    a second reaction gas supplying portion that supplies a second reaction gas to the surface where the substrate receiving portion is provided in the turntable, the second reaction gas supplying portion being away from the first reaction gas supplying portion in a rotation direction of the turntable;
    a separation area located between a first process area where the first reaction gas is supplied and a second process area where the second reaction gas is supplied, thereby separating atmospheres of the first process area and the second process area;
    a center area that is located at substantially a center of the vacuum chamber and has an ejection hole through which a separation gas is ejected to the surface where the substrate receiving portion is provided in the turntable, thereby separating the atmospheres of the first process area and the second process area;
    a transfer mechanism that transfers the substrate to and from the turntable in the vacuum chamber;
    a locking member that locks a part of an upper surface of the substrate in order to keep the substrate in the substrate receiving portion of the turntable; and
    an elevation mechanism that moves the locking member and the substrate upward from and downward to the turntable.

2. The film deposition apparatus of claim 1, wherein the substrate receiving portion is a concave portion, and wherein an upper surface of the turntable is substantially at the same elevation as an upper surface of the substrate placed in the substrate receiving portion.

3. The film deposition apparatus of claim 1, wherein the elevation mechanism includes three or more first lift pins that move the substrate upward and downward, and three or more second lift pins that move the locking member upward and downward.

4. The film deposition apparatus of claim 1, wherein the locking member has a streamline shape that reduces gas flow turbulence when the turntable is rotated.

5. A film deposition apparatus for depositing a thin film on a substrate by placing plural of the substrates in corresponding plural concave portions provided in an upper surface of a turntable, and rotating the turntable to alternately expose the plural substrates to different reaction gases supplied to corresponding process areas, the film deposition apparatus comprising:
    plural reaction gas supplying portions that are provided away from ceilings of the corresponding process areas, and supply corresponding reaction gases toward the substrates;
    an inert gas supplying portion that supplies an inert gas to a separation area provided between the process areas;
    at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to a corresponding one of the process areas and the separation gas supplied to the separation area by way of the corresponding one of the process areas; and
    locking members provided in or around the corresponding concave portions of the turntable in order to keep the substrates in the concave portions.

6. A film deposition apparatus for depositing a thin film on a substrate by placing plural of the substrates in corresponding plural concave portions provided in an upper surface of a turntable, and rotating the turntable to alternately expose the plural substrates to different reaction gases supplied to corresponding process areas, the film deposition apparatus comprising:
    plural reaction gas supplying portions that are introduced from a side wall of the vacuum chamber toward a rotation center of the turntable, arranged away from a ceiling of the vacuum chamber, and supply corresponding reaction gases toward the substrates placed on the turntable;
    an inert gas supplying portion that supplies an inert gas toward the substrates placed on the turntable, in a separation area provided between the process areas;
    at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to corresponding one of the process areas and the separation gas supplied to the separation area by way of the corresponding one of the process areas; and
    locking members provided in or around the corresponding concave portions of the turntable so that the locking members leave gaps with respect to the substrates placed in the concave portions but lock the substrates in case the substrates may be moved up when the turntable is being rotated.

7. A film deposition apparatus for depositing a thin film on an upper surface of a substrate by placing plural of the substrates in corresponding plural concave portions provided in an upper surface of a turntable, and rotating the turntable to alternately expose the plural substrates to different reaction gases supplied to corresponding process areas, the film deposition apparatus comprising:
    plural reaction gas supplying portions that are provided away from ceilings of the corresponding process areas, and supply corresponding reaction gases toward the substrates;
    an inert gas supplying portion that supplies an inert gas to a separation area provided between the process areas;
    at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to a corresponding one of the process areas and the separation gas supplied to the separation area by way of the corresponding one of the process areas;

locking members that are provided in or around the corresponding concave portions of the turntable and lock upper surfaces of the substrates placed in the concave portions; and a control portion that enables placing the substrates in the concave portions so that centers of the substrates deviate from centers of the corresponding concave portions, before rotating the turntable.

8. A film deposition apparatus for depositing a thin film on an upper surface of a substrate by placing plural of the substrates in corresponding plural concave portions provided in an upper surface of a turntable, and rotating the turntable to alternately expose the plural substrates to different reaction gases supplied to corresponding process areas, the film deposition apparatus comprising:

plural reaction gas supplying portions that are provided away from ceilings of the process areas, and supply corresponding reaction gases toward the substrates;

an inert gas supplying portion that supplies an inert gas to a separation area provided between the process areas;

at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to a corresponding one of the process areas and the separation gas supplied to the separation area by way of the corresponding one of the process areas; and locking members that are provided in or around the corresponding concave portions of the turntable and lock the substrates by contacting upper circumferential portions of the substrates, thereby keeping the substrates in the concave portions.

9. A film deposition apparatus for depositing a thin film on an upper surface of a substrate by placing plural of the substrates in corresponding plural concave portions provided in an upper surface of a turntable, and rotating the turntable to alternately expose the plural substrates to different reaction gases supplied to corresponding process areas, the film deposition apparatus comprising:

plural reaction gas supplying portions that are provided away from ceilings of the corresponding process areas, and supply corresponding reaction gases toward the substrate;

a first inert gas supplying portion that supplies an inert gas to a separation area provided between the process areas;

a second inert gas supplying portion that supplies an inert gas from a center portion of the vacuum chamber;

at least two evacuation portions that evacuate the vacuum chamber to reduced pressures through corresponding evacuation ports provided outside of the corresponding process areas and along a circumferential direction of the turntable, wherein one of the evacuation portions evacuates one of the reaction gases supplied to a corresponding one of the process areas, the inert gas supplied from the first inert gas supplying portion to the corresponding separation area, and the inert gas supplied from the center area, by way of the corresponding one of the process areas; and locking members that are provided in or around the corresponding concave portions and lock upper surfaces of the substrates in the concave portions.

10. A film deposition method for depositing a film on a substrate by carrying out plural cycles of alternately supplying at least two kinds of reaction gases that react with each other on the substrate to produce a layer of a reaction product in a vacuum chamber, the film deposition method comprising steps of:

transferring the substrate into the vacuum chamber through a transfer opening formed in the vacuum chamber, and placing the substrate in a substrate receiving portion of a turntable in the vacuum chamber so that the substrate is placed in an outermost position with respect to a center of the turntable;

rotating the turntable; and depositing a film on the substrate by supplying a first reaction gas from a first reaction gas supplying portion toward a surface where the substrate receiving portion is formed in the turntable, supplying a second reaction gas from a second reaction gas supplying portion located away from the first reaction gas supplying portion, toward the surface where the substrate receiving portion is formed in the turntable, and supplying a separation gas from a separation area located between the first reaction gas supplying portion and the second reaction gas supplying portion.

11. A film deposition method for depositing a film on a substrate by carrying out a cycle of alternately supplying at least two kinds of reaction gases that react with each other on the substrate to produce a layer of a reaction product in a vacuum chamber, the film deposition method comprising steps of:

transferring the substrate into the vacuum chamber through a transfer opening formed in the vacuum chamber and placing the substrate on lift pins provided in a substrate receiving portion having a concave shape in a turntable in order to place the substrate in the substrate receiving portion;

moving the lift pins downward so that the substrate is moved downward below an upper surface of the turntable;

moving the lift pins horizontally outward in a radius direction of the turntable so that an outermost part of the substrate contacts or is positioned close to an inner circumferential surface of the substrate receiving portion;

moving the lift pins further downward so that the substrate is placed on a bottom surface of the substrate receiving portion;

rotating the turntable; and depositing a film on the substrate by supplying a first reaction gas from a first reaction gas supplying portion toward a surface where the substrate receiving portion is formed in the turntable, supplying a second reaction gas from a second reaction gas supplying portion located away from the first reaction gas supplying portion, toward the surface where the substrate receiving portion is formed in the turntable, and supplying a separation gas from a separation area located between the first reaction gas supplying portion and the second reaction gas supplying portion.

* * * * *